(12) United States Patent
Lee et al.

(10) Patent No.: US 9,691,954 B2
(45) Date of Patent: Jun. 27, 2017

(54) LIGHT-EMITTING DIODE (LED) PACKAGE

(71) Applicant: SAMSUNG ELECTRONICS CO., LTD., Suwon-si (KR)

(72) Inventors: Dong-kuk Lee, Suwon-si (KR); Si-han Kim, Seoul (KR); Hyung-kun Kim, Suwon-si (KR); Yong-min Kwon, Seoul (KR); Geun-woo Ko, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/162,754

(22) Filed: May 24, 2016

(65) Prior Publication Data

US 2017/0033268 A1    Feb. 2, 2017

(30) Foreign Application Priority Data

Jul. 30, 2015    (KR) ........................ 10-2015-0108148

(51) Int. Cl.
*H01L 33/00* (2010.01)
*H01L 33/60* (2010.01)
(Continued)

(52) U.S. Cl.
CPC ............ *H01L 33/60* (2013.01); *H01L 33/007* (2013.01); *H01L 33/06* (2013.01); *H01L 33/18* (2013.01);
(Continued)

(58) Field of Classification Search
CPC ......... H01L 33/04; H01L 33/10; H01L 33/36; H01L 33/38; H01L 33/405; H01L 33/46;
(Continued)

(56) References Cited

U.S. PATENT DOCUMENTS 6,372,608 B1    4/2002    Shimoda et al.
6,645,830 B2    11/2003    Shimoda et al.
(Continued)

FOREIGN PATENT DOCUMENTS

JP    2007-335731 A    12/2007
JP    2010-10474 A    1/2010
(Continued)

*Primary Examiner* — Sonya D McCall Shepard
(74) *Attorney, Agent, or Firm* — Sughrue Mion, PLLC

(57) ABSTRACT

A light-emitting diode (LED) package includes a light-emitting structure including a first conductive-type semiconductor layer, an active layer, and a second conductive-type semiconductor layer; an isolating insulation layer; a first connection electrode portion and a second connection electrode portion electrically connected to the first conductive-type semiconductor layer and the second conductive-type semiconductor layer, respectively; a first electrode pad and a second electrode pad electrically connected to the first connection electrode portion and the second connection electrode portion, respectively; a first molding resin layer provided between the first electrode pad and the second electrode pad; a first pillar electrode and a second pillar electrode electrically connected to the first electrode pad and the second electrode pad, respectively; and a second molding resin layer provided on the first molding resin layer, the first electrode pad, and the second electrode pad, and between the first pillar electrode and the second pillar electrode.

19 Claims, 40 Drawing Sheets

(51) Int. Cl.
*H01L 33/06* (2010.01)
*H01L 33/32* (2010.01)
*H01L 33/18* (2010.01)
*H01L 33/62* (2010.01)
*H01L 33/38* (2010.01)
*H01L 33/56* (2010.01)

(52) U.S. Cl.
CPC ............ *H01L 33/32* (2013.01); *H01L 33/382* (2013.01); *H01L 33/56* (2013.01); *H01L 33/62* (2013.01); *H01L 2933/005* (2013.01); *H01L 2933/0016* (2013.01); *H01L 2933/0058* (2013.01)

(58) Field of Classification Search
CPC ....... H01L 33/465; H01L 33/48; H01L 33/52; H01L 33/54; H01L 33/56; H01L 33/42; H01L 33/44; H01L 33/50; H01L 33/58; H01L 25/075; H01L 27/15; H01L 33/08; H01L 31/035236; H01L 31/12; H01L 33/00
USPC ............... 257/13, 14, 21, 79, 80, 81, 98, 88, 257/E33.001–E33.017, E33.056–E33.068, 257/E23.02; 438/26, 29, 118
See application file for complete search history.

(56) References Cited

U.S. PATENT DOCUMENTS

| | | |
|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 2006/0278886 A1 | 12/2006 | Tomoda et al. |
| 2011/0284909 A1* | 11/2011 | Sugizaki ............. H01L 33/0079 257/99 |
| 2013/0200335 A1 | 8/2013 | Cho |
| 2014/0284654 A1 | 9/2014 | Akiyama et al. |
| 2014/0306242 A1 | 10/2014 | Kim et al. |
| 2014/0319566 A1 | 10/2014 | Perzlmaier et al. |
| 2015/0034985 A1 | 2/2015 | Tomizawa et al. |
| 2015/0236228 A1 | 8/2015 | Kim et al. |
| 2015/0243846 A1 | 8/2015 | Kwon et al. |
| 2015/0357250 A1 | 12/2015 | Kim et al. |

FOREIGN PATENT DOCUMENTS

| | | |
|---|---|---|
| JP | 2014-207327 A | 10/2014 |
| KR | 10-2013-0028288 A | 3/2013 |
| KR | 10-2014-0061857 A | 5/2014 |

* cited by examiner

LIGHT-EMITTING DIODE (LED) PACKAGE

CROSS-REFERENCE TO RELATED APPLICATION

This application claims priority from Korean Patent Application No. 10-2015-0108148, filed on Jul. 30, 2015 in the Korean Intellectual Property Office, the disclosure of which is incorporated herein in its entirety by reference.

BACKGROUND

The exemplary embodiments disclosed herein relate to a light source package, and more particularly, to a light-emitting diode (LED) package.

Light-emitting diode (LED) packages are widely used as light source packages due to various advantages such as low power consumption and high luminance. LED packages should to be manufactured to have excellent reliability with regard to wetting, tolerance, and strength. Also, it may be necessary for the LED packages to have improved light extraction efficiency in order to realize high luminance.

SUMMARY

One or more exemplary embodiments provide a light-emitting diode (LED) package having excellent reliability with regard to wetting, tolerance, and strength, and improved light extraction efficiency.

According to an aspect of an exemplary embodiment, there is provided a light-emitting diode (LED) package including: a light-emitting structure including a first conductive-type semiconductor layer, an active layer provided on the first conductive-type semiconductor layer, and a second conductive-type semiconductor layer provided on the active layer; an isolating insulation layer provided on two side portions of the light-emitting structure and an upper portion of the light-emitting structure, the upper portion connecting the two side portions; a first connection electrode portion electrically connected to the first conductive-type semiconductor layer; a second connection electrode portion electrically connected to the second conductive-type semiconductor layer; a first electrode pad electrically connected to the first connection electrode portion; a second electrode pad electrically connected to the second connection electrode portion; a first molding resin layer provided between the first electrode pad and the second electrode pad; a first pillar electrode electrically connected to the first electrode pad; a second pillar electrode electrically connected to the second electrode pad; and a second molding resin layer provided on the first molding resin layer, the first electrode pad, and the second electrode pad, and between the first pillar electrode and the second pillar electrode.

The first molding resin layer may include a material layer which has a reflectivity that is higher than a reflectivity of the second molding resin layer, and the second molding resin layer may include a material layer which has a reliability that is higher than a reliability of the first molding resin layer.

The first molding resin layer may be an encapsulation layer sealing a gap between the first electrode pad and the second electrode pad.

The LED package may further include a first reflective layer provided on the first molding resin layer.

The LED package may further include a second reflective layer provided between the first molding resin layer and the second molding resin layer.

The first molding resin layer may contact a surface and a side wall of the first electrode pad, a surface and a sidewall of the second electrode pad, a side wall of the first pillar electrode, and a sidewall of the second pillar electrode, and the second molding resin layer may contact the first molding resin layer.

The second molding resin layer may be an encapsulation layer sealing a gap between the first pillar electrode and the second pillar electrode.

The light-emitting structure may be a mesa-type light-emitting structure, the isolating insulation layer may insulate the mesa-type light-emitting structure, the first connection electrode portion may include a pole electrode layer penetrating the isolating insulation layer, and the light-emitting structure further may further include a first contact layer provided on the first conductive-type semiconductor layer under the pole electrode layer.

The light-emitting structure may be a mesa-type light-emitting structure, the isolating insulation layer may insulate the mesa-type light-emitting structure, the second connection electrode portion may include a plate electrode layer, and the plate electrode layer may be provided in the isolating insulation layer, and the light-emitting structure may further include a second contact layer provided on the second conductive-type semiconductor layer under the plate electrode layer.

The first electrode pad and the second electrode pad may be provided on the isolating insulation layer on the upper portion and the two side portions of the light-emitting structure.

According to an aspect of another exemplary embodiment, there is provided a light-emitting diode (LED) package including: a first pad area including: a first portion of a light-emitting structure including a first conductive-type semiconductor layer, an active layer, and a second conductive-type semiconductor layer, and a first electrode pad electrically connected to the first conductive-type semiconductor layer; a second pad area including: a second portion of the light-emitting structure, and a second electrode pad electrically connected to the second conductive-type semiconductor layer; a pad isolating area which includes a first molding resin layer and electrically isolates the first pad area and the second pad area from each other; a first pillar electrode formed on the first electrode pad in the first pad area and a second pillar electrode provided on the second electrode pad in the second pad area; and a second molding resin layer provided between the first pillar electrode in the first pad area and the second pillar electrode in the second pad area, and on the pad isolating area.

The first molding resin layer may include a material layer which has a reflectivity that is higher than a reflectivity of the second molding resin layer, and the second molding resin layer may include a material layer which has a reliability that is higher than a reliability of the first molding resin layer.

The LED package may further include a first reflective layer provided on the first molding resin layer in the pad isolating area.

The first molding resin layer may contact a surface of the first electrode pad, a surface of the second electrode pad, a side wall of the first pillar electrode, and a side wall of the second pillar electrode, and the second molding resin layer may contact the first molding resin layer in the pad isolating area.

The LED package may further include a second reflective layer provided between the first molding resin layer and the second molding resin layer in the first pad area, the second pad area, and the pad isolating area.

BRIEF DESCRIPTION OF THE DRAWINGS

The above and/or other aspects will be more clearly understood from the following detailed description of exemplary embodiments taken in conjunction with the accompanying drawings in which.

DETAILED DESCRIPTION OF EXEMPLARY EMBODIMENTS

Figure 1:
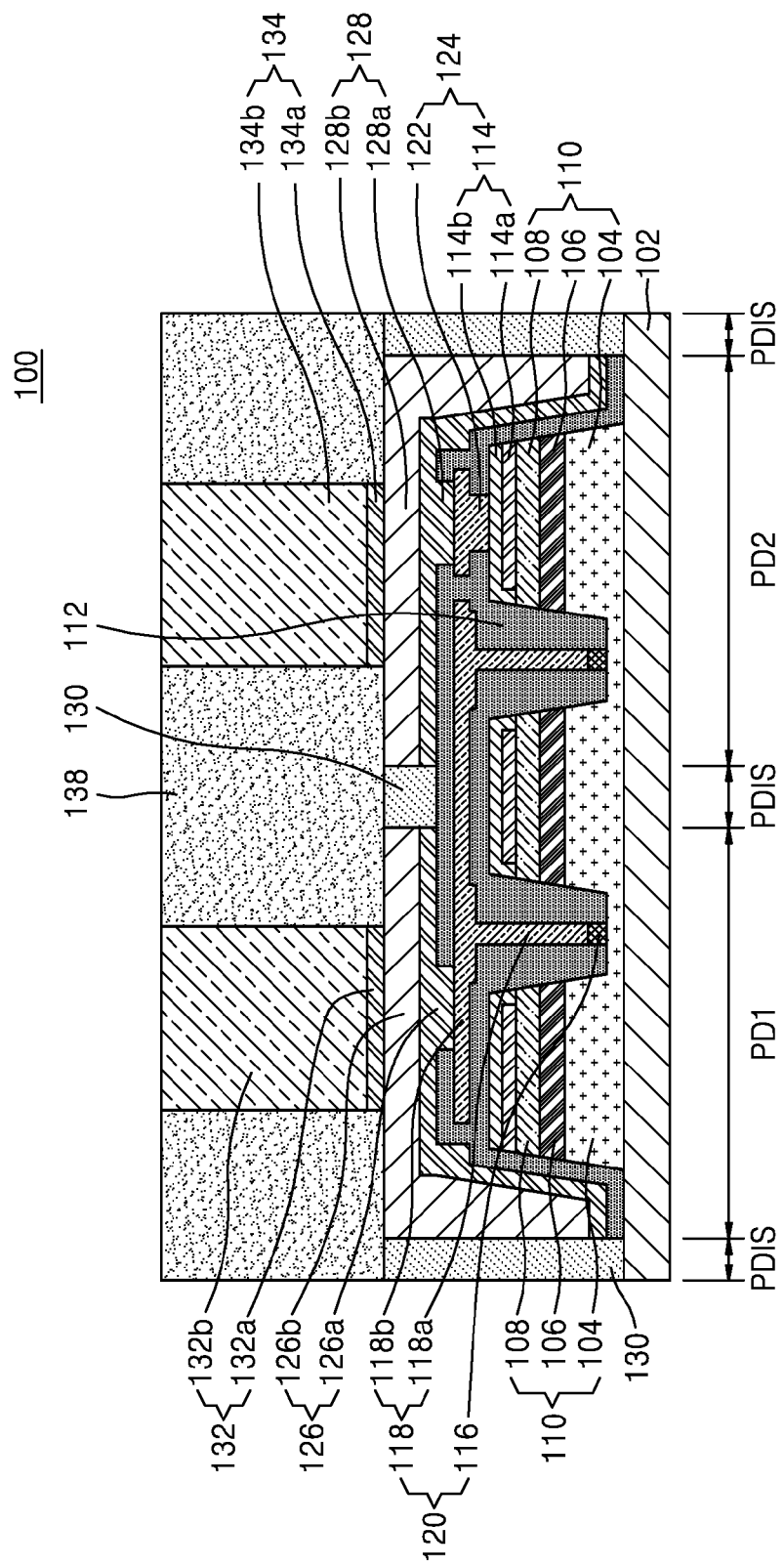
FIG. 1 is a cross-sectional view of an LED package according to an exemplary embodiment.

Hereinafter, exemplary embodiments will be described with reference to the accompanying drawings. The exemplary embodiments may, however, be embodied in many different forms and should not be construed as being limited to the exemplary embodiments set forth herein; rather, these exemplary embodiments are provided so that this disclosure will be thorough and complete, and will fully convey the exemplary embodiments to those of ordinary skill in the art. It should be understood, however, that there is no intent to limit the exemplary embodiments to the particular forms disclosed herein, but on the contrary, the exemplary embodiments cover all modifications, equivalents, and alternatives falling within the spirit and scope of the exemplary embodiments. In the drawings, the dimensions of structures are exaggerated for clarity of the exemplary embodiments.

It will be understood that when an element, such as a layer, a region, or a substrate, is referred to as being "on," "connected to" or "coupled to" another element, the element may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items. Expressions such as "at least one of", when preceding a list of elements, modify the entire list of elements and do not modify the individual elements of the list.

Also, though terms "first" and "second" are used to describe various members, components, regions, layers, and/or portions in various exemplary embodiments, the members, components, regions, layers, and/or portions are not limited to these terms. These terms are used only to differentiate one member, component, region, layer, or portion from another one. Therefore, a member, a component, a region, a layer, or a portion referred to as a first member, a first component, a first region, a first layer, or a first portion in an exemplary embodiment may be referred to as a second member, a second component, a second region, a second layer, or a second portion in another exemplary embodiment.

Spatially relative terms, such as "above", "upper", "beneath", "below", "lower", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the exemplary embodiments. As used herein, the singular forms "a", "an", and "the" are intended to include the plural forms as well, unless the context clearly indicates otherwise. It will be understood that terms such as "comprise", "include", and "have", when used herein, specify the presence of stated features, integers, steps, operations, elements, components, or combinations thereof, but do not preclude the presence or addition of one or more other features, integers, steps, operations, elements, components, or combinations thereof.

Hereinafter, exemplary embodiments will be described with reference to the accompanying drawings. In the accompanying drawings, the modifications of the illustrated shapes may be expected according to manufacturing technologies and/or tolerance. Therefore, the exemplary embodiments should not be construed as being limited to specific shapes of the illustrated regions. The shapes may be changed during the manufacturing processes. The following exemplary embodiments may be combined in many different ways.

FIG. 1 is a cross-sectional view of a light-emitting diode (LED) package 100 according to an exemplary embodiment.

The LED package 100 may be a chip scale package (CSP) or a wafer level package (WLP). In the following description, the terms "upper portion", "top surface", "lower portion", "bottom surface", and "side surface" are based on the drawings and may be changed according to an actual arrangement direction of a device or a package. In the drawings of the present application, only certain significant elements may be illustrated, and it is understood that many other elements may also be included, as would be appreciated by an artisan having ordinary skill in the art.

The LED package 100 has a light-emitting structure 110 including a first conductive-type semiconductor layer 104, an active layer 106, and a second conductive-type semiconductor layer 108. Although the light-emitting structure 110 may have various structures, a mesa-type light-emitting structure is illustrated as an example in the present exemplary embodiment. Although it is illustrated in the drawings that the LED package 100 includes three light-emitting structures 110, this is for convenience of description, and the LED package 100 may include more or less than three light-emitting structures 110.

The light-emitting structure 110 may be formed on a substrate 102. The substrate 102 may be a semiconductor wafer. The substrate 102 may be a silicon-based substrate. The silicon-based substrate may be a silicon (Si) substrate or a silicon carbide (SiC) substrate. When the silicon-based substrate is used as the substrate 102, it may be more suitable for an increase in a diameter of a wafer, and package productivity may be improved due to a relative low price.

The substrate 102 may include an insulating material, a conductive material, or a semiconductor material, such as sapphire, $MgAl_2O_4$, MgO, $LiAlO_2$, $LiGaO_2$, and GaN. Sapphire, which is a crystal having electrical insulating properties and hexa-rhombo R3c symmetry, may have a lattice constant of about 13.001 Å and about 4.758 Å in a c-axis direction and an a-axis direction and may have a C(0001) plane, an A(1120) plane, and an R(1102) plane. In this case, since the C plane facilitates the growth of a nitride thin film and is stable at a high temperature, the C plane may be used as a substrate for the growth of a nitride material.

The first conductive-type semiconductor layer 104 included in the light-emitting structure 110 may be an n-type semiconductor layer. The second conductive-type semiconductor layer 108 included in the light-emitting structure 110 may be a p-type semiconductor layer. The first conductive-type semiconductor layer 104 and the second conductive-type semiconductor layer 108 may include a nitride semiconductor, for example, GaN/InGaN.

The first conductive-type semiconductor layer 104 and the second conductive-type semiconductor layer 108 may include a nitride semiconductor, for example, $Al_xIn_yGa_{1-x-y}N$ ($0 \leq x \leq 1$, $0 \leq y \leq 1$, $0 \leq x+y \leq 1$). Each of the first conductive-type semiconductor layer 104 and the second conductive-type semiconductor layer 108 may be a single layer or a plurality of layers having different doping concentrations, different compositions, or the like. Alternatively, the first conductive-type semiconductor layer 104 and the second conductive-type semiconductor layer 108 may include an AlInGaP-based semiconductor or an AlInGaAs-based semiconductor.

The active layer 106 disposed between the first conductive-type semiconductor layer 104 and the second conductive-type semiconductor layer 108 may emit light having predetermined energy through recombination of electrons and holes. The active layer 106 may have a multi-quantum well (MQW) structure in which a quantum well layer and a quantum barrier layer are alternately stacked. In the case of a nitride semiconductor, a GaN/InGaN structure may be used. The active layer 106 may have a single quantum well (SQW) structure using a nitride semiconductor.

An isolating insulation layer 112 for forming electrical insulation with other elements is formed on two side portions and an upper portion of the light-emitting structure 110. The isolating insulation layer 112 may include a silicon oxide layer. The isolating insulation layer 112 may insulate the mesa-type light-emitting structure 110. In the isolating insulation layer 112, a first connection electrode portion 120 and a second connection electrode portion 124 electrically connected to the first conductive-type semiconductor layer 104 and the second conductive-type semiconductor layer 108 are respectively formed.

The first connection electrode portion 120 may include an electrode layer 118 including a pole electrode layer 118a penetrating the isolating insulation layer 112 and a first plate electrode layer 118b connected to the pole electrode layer 118a. The pole electrode layer 118a is a column electrode layer or a pillar electrode layer. The first connection electrode portion 120 may include a first contact layer 116 on the first conductive-type semiconductor layer 104 that is below the pole electrode layer 118a. The first contact layer 116 may be an ohmic metal layer. The first contact layer 116 may include a conductive material layer, for example, one or more selected from silver (Ag), aluminum (Al), nickel (Ni), chromium (Cr), copper (Cu), gold (Au), palladium (Pd), platinum (Pt), tin (Sn), tungsten (W), rhodium (Rh), iridium (Jr), ruthenium (Ru), magnesium (Mg), zinc (Zn), titanium (Ti), and an alloy thereof.

The second connection electrode portion 124 may include a second plate electrode layer 122 in the isolating insulation layer 112 that is above the second conductive-type semiconductor layer 108. The second connection electrode portion 124 may include a second contact layer 114 on the second conductive-type semiconductor layer 108 that is below the second plate electrode layer 122. The second contact layer 114 may include two metal layers 114a and 114b having adhesive properties and reflective properties. The second contact layer 114 may include the same material as the first contact layer 116.

A first electrode pad 126 and a second electrode pad 128 electrically connected to the first connection electrode portion 120 and the second connection electrode portion 124 respectively are formed on the first and second connection electrode portions 120 and 124 and the isolating insulation layer 112. The first electrode pad 126 and the second electrode pad 128 are formed on the isolating insulation layer 112, which is formed on the two side portions and the upper portion of the light-emitting structure 110.

The first electrode pad 126 may include a first pad seed layer 126a electrically connected to the first plate electrode layer 118b and a first pad layer 126b on the first pad seed layer 126a. The second electrode pad 128 may include a second pad seed layer 128a electrically connected to the second plate electrode layer 122 and a second pad layer 128b on the second pad seed layer 128a. The first pad seed layer 126a, the second pad seed layer 128a, the first pad layer 126b, and the second pad layer 128b may include a metal layer, for example, a copper layer.

A first molding resin layer 130 is formed between the first electrode pad 126 and the second electrode pad 128. The first molding resin layer 130 may be formed between the first electrode pad 126 and the second electrode pad 128 on the light-emitting structure 110 and between the first electrode pad 126 and the second electrode pad 128 on a side portion of the light-emitting structure 110. The first molding resin layer 130 may be an encapsulation layer sealing a gap between the first electrode pad 126 and the second electrode pad 128.

The first molding resin layer 130 may include a material layer having reflectivity higher than a reflectivity of a second molding resin layer 138 to be described later. The first molding resin layer 130 may include a material having high reflectivity, for example, tungsten or silicon, and thus may have reflectivity higher than a reflectivity of a second molding resin layer to be described later. Due to the first molding resin layer 130, light extraction efficiency of the LED package 100 may be improved.

When the first and second electrode pads 126 and 128 and the first molding resin layer 130 are formed, the LED package 100 may be divided into pad areas PD1 and PD2 and a pad isolating area PDIS. The pad areas PD1 and PD2 may be divided into a first pad area PD1 and a second pad area PD2. The first pad area PD1 may include the light-emitting structure 110 including the first conductive-type semiconductor layer 104, the active layer 106, and the second conductive-type semiconductor layer 108, and the first electrode pad 126 electrically connected to the first conductive-type semiconductor layer 104.

The second pad area PD2 may include the light-emitting structure 110, and the second electrode pad 128 electrically connected to the second conductive-type semiconductor layer 108. The pad isolating area PDIS may include the first molding resin layer 130 so as to electrically isolate the first pad area PD1 and the second pad area PD2 from each other.

A first pillar electrode 132 and a second pillar electrode 134 electrically connected to the first electrode pad 126 and the second electrode pad 128 respectively are formed on the first electrode pad 126 and the second electrode pad 128. The first pillar electrode 132 and the second pillar electrode 134 are respectively formed on the first electrode pad 126 in the first pad area PD1 and the second electrode pad 128 in the second pad area PD2.

The first pillar electrode 132 and the second pillar electrode 134 may be electrically connected to an external wire substrate by using a solder ball or in the form of a flip chip. The first pillar electrode 132 may include a first pillar seed layer 132a electrically connected to the first electrode pad 126 and a first pillar layer 132b on the first pillar seed layer 132a.

The second pillar electrode 134 may include a second pillar seed layer 134a electrically connected to the second electrode pad 128 and a second pillar layer 134b on the second pillar seed layer 134a. The first pillar seed layer 132a, the second pillar seed layer 134a, the first pillar layer 132b, and the second pillar layer 134b may include a metal layer, for example, a copper layer.

The second molding resin layer 138 is formed between the first pillar electrode 132 and the second pillar electrode 134 on the first molding resin layer 130, the first electrode pad 126, and the second electrode pad 128. The second molding resin layer 138 may be placed between the first pillar electrode 132 in the first pad area PD1 and the second pillar electrode 134 in the second pad area PD2, and in the pad isolating area PDIS. The second molding resin layer 138 may be an encapsulation layer sealing a gap between the first pillar electrode 132 and the second pillar electrode 134.

The second molding resin layer 138 may include a more reliable material layer than a material layer of the first molding resin layer 130. The second molding resin layer 138 may include a material more reliable in wetting, tolerance, strength, and the like, compared to a material layer of the first molding resin layer 130.

The LED package 100 as described above includes the first molding resin layer 130 having high reflectivity between the first electrode pad 126 and the second electrode pad 128. The LED package 100 includes the second molding resin layer 138 having high reliability between the first pillar electrode 132 and the second pillar electrode 134. Accordingly, the LED package 100 may have increased light extraction efficiency and improved reliability.

Figure 2:
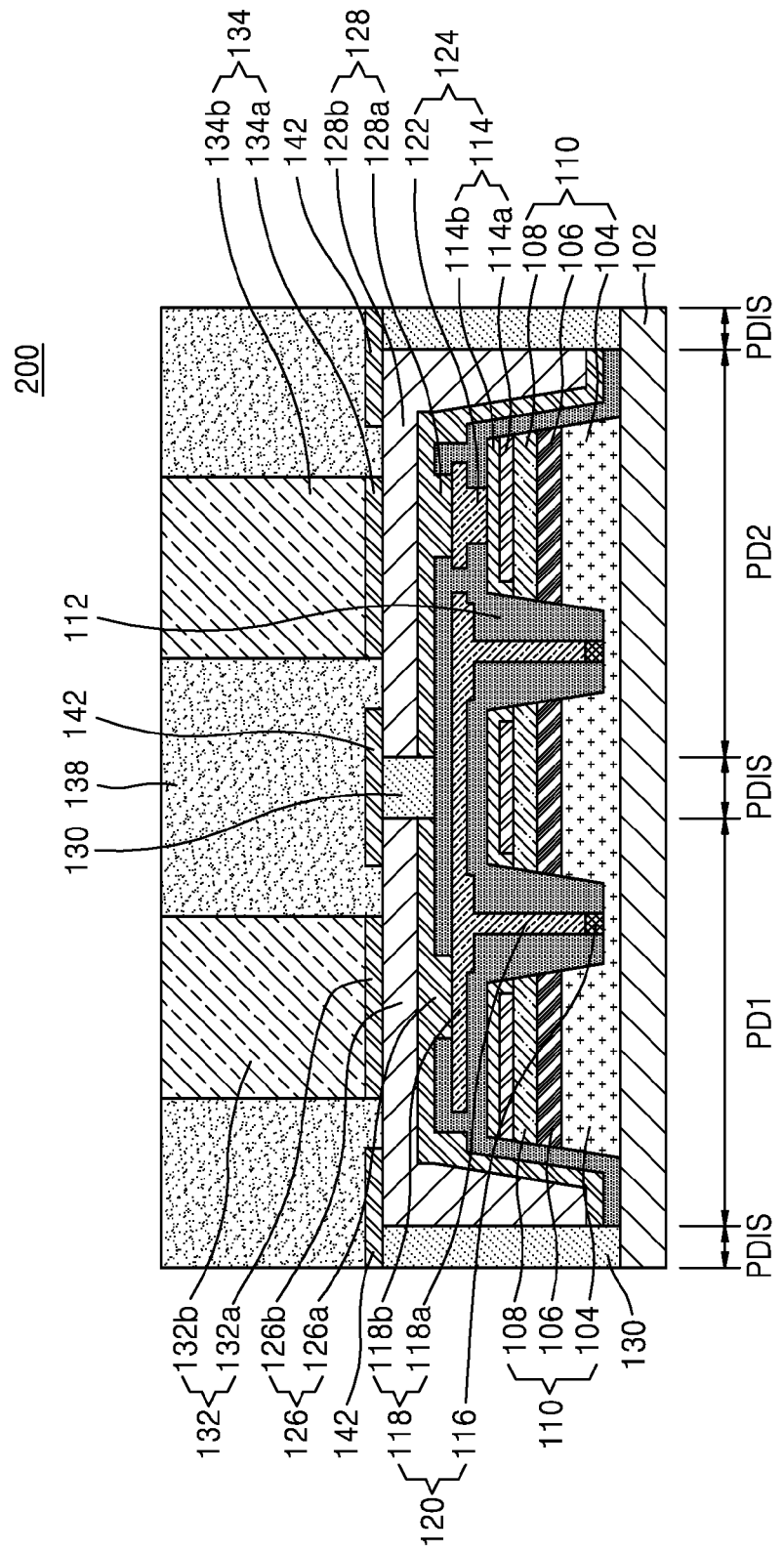
FIG. 2 is a cross-sectional view of an LED package according to another exemplary embodiment.

FIG. 2 is a cross-sectional view of an LED package 200 according to another exemplary embodiment.

The LED package 200 may be the same as the LED package 100 of FIG. 1 except that a first reflective layer 142 is further formed on the first molding resin layer 130. Accordingly, a description of features of FIG. 2 that has already been made with reference to FIG. 1 may be omitted or briefly mentioned.

In the LED package 200, the first reflective layer 142 is further formed on the first molding resin layer 130 between the first electrode pad 126 and the second electrode pad 128. The first reflective layer 142 is further formed on the first molding resin layer 130 in the pad isolating area PDIS. The first reflective layer 142 may include a metal layer, for example, a copper layer. The first reflective layer 142 may include the same material as material included in the first pillar seed layer 132a and the second pillar seed layer 134a.

The LED package 200 as described above includes the first reflective layer 142 on the first molding resin layer 130 and thus may release light emitted from the light-emitting structure 110 to the outside more efficiently. As a result, the LED package 200 may have improved light extraction efficiency.

Figure 3:
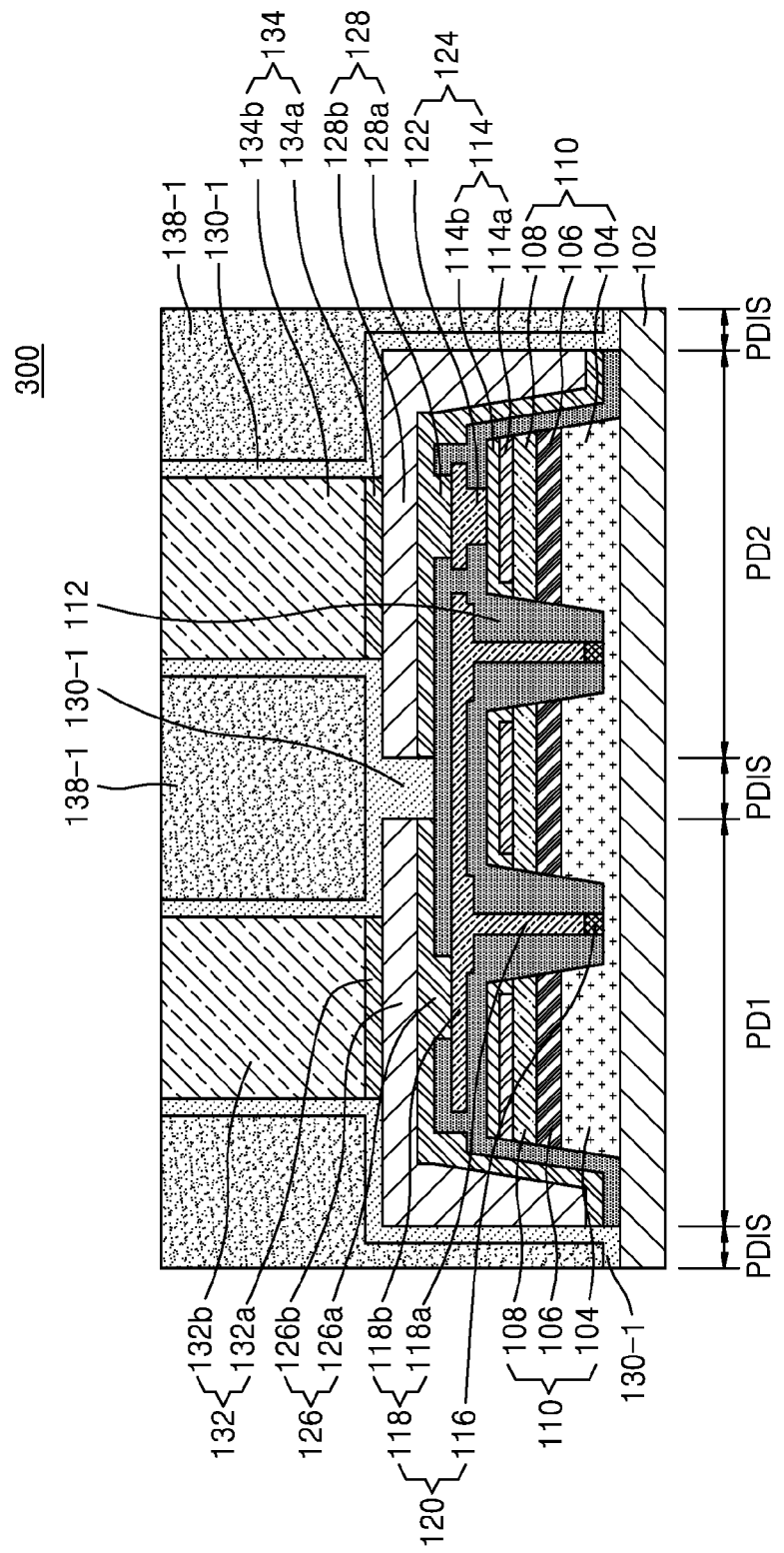
FIG. 3 is a cross-sectional view of an LED package according to another exemplary embodiment.

FIG. 3 is a cross-sectional view of an LED package 300 according to another exemplary embodiment.

The LED package 300 may be the same as the LED package 100 of FIG. 1 except that a first molding resin layer 130-1 and a second molding resin layer 138-1 have different formation positions from the first molding resin layer 130 and the second molding resin layer 138 of FIG. 1. Accordingly, a description of features of FIG. 3 that has already been made with reference to FIG. 1 may be omitted or briefly mentioned.

The LED package 300 may include the first molding resin layer 130-1 and the second molding resin layer 138-1. The first molding resin layer 130-1 is formed on a surface and two side walls of each of the first electrode pad 126 and the second electrode pad 128. The first molding resin layer 130-1 may be formed on two side walls of each of the first pillar electrode 132 and the second pillar electrode 134 and placed between the first pillar electrode 132 and the second pillar electrode 134.

The first molding resin layer 130-1 may be a coating resin layer placed between the first electrode pad 126 and the second electrode pad 128. The first molding resin layer 130-1 may be a coating resin layer placed between the first pillar electrode 132 and the second pillar electrode 134. The first molding resin layer 130-1 may include a material having reflectivity higher than a reflectivity of the second molding resin layer 138-1 to be formed later.

The second molding resin layer 138-1 may be formed between the first pillar electrode 132 and the second pillar electrode 134 including the first molding resin layer 130-1 on side walls of the first pillar electrode 132 and the second pillar electrode 134. The second molding resin layer 138-1 is formed on the first molding resin layer 130-1 on side walls of the first electrode pad 126 and the second electrode pad 128. The second molding resin layer 138-1 is formed on a side of the first molding resin layer 130-1 in the pad isolating area PDIS. The second molding resin layer 138-1 may be placed between the first electrode pad 126 and the second electrode pad 128. The second molding resin layer 138-1 may include a material having higher reliability compared to the first molding resin layer 130-1.

The LED package 300 as described above includes the first molding resin layer 130-1, which has high reflectivity, on the surface and the two side walls of each of the first electrode pad 126 and the second electrode pad 128 and the two side walls of each of the first pillar electrode 132 and the second pillar electrode 134. The LED package 300 includes the second molding resin layer 138-1, which has high reliability, between the first pillar electrode 132 and the second pillar electrode 134 and on the first molding resin layer 130-1 on the side walls of the first electrode pad 126 and the second electrode pad 128. Accordingly, the LED package 300 may have increased light extraction efficiency and improved reliability.

Figure 4:
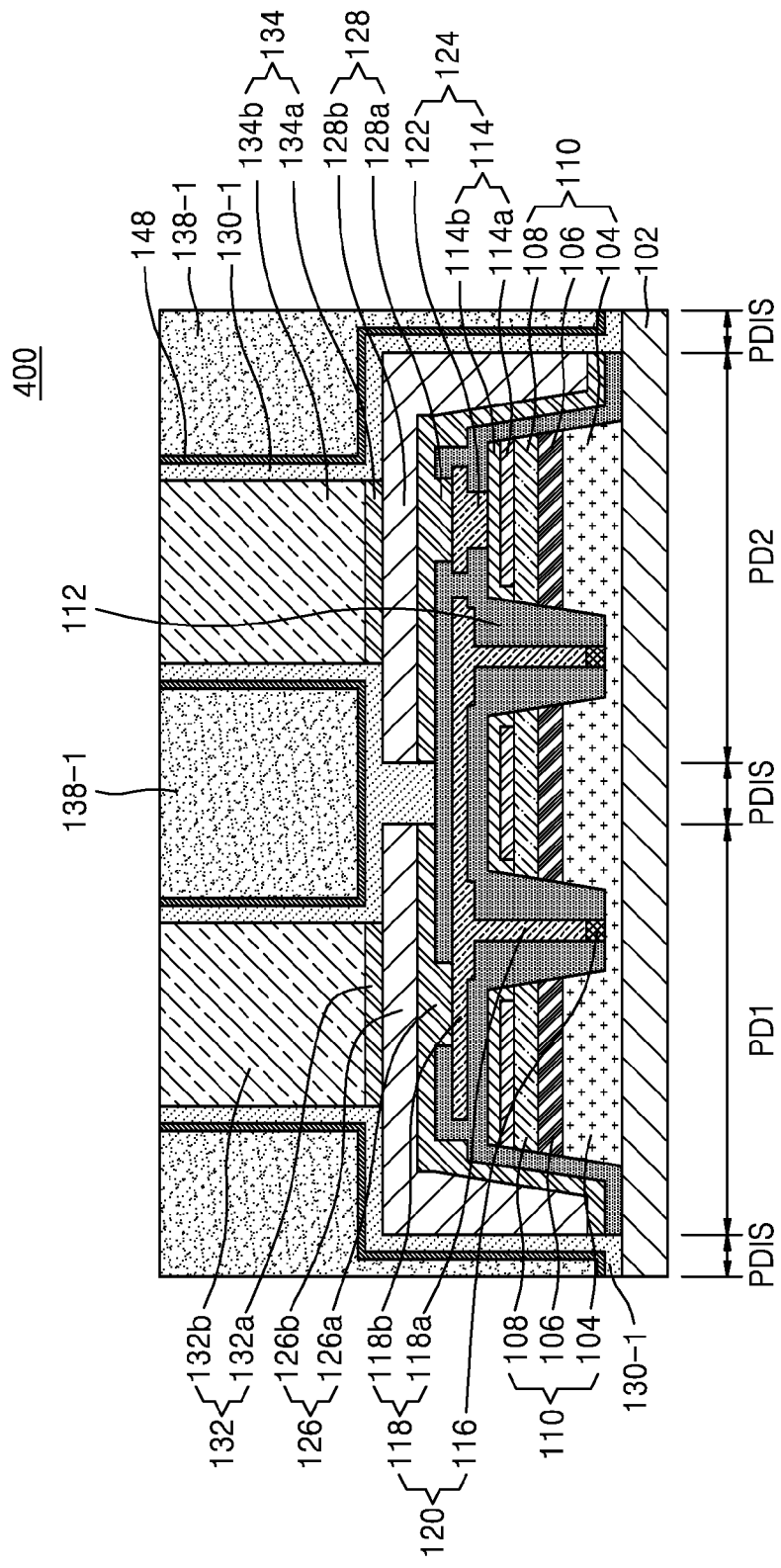
FIG. 4 is a cross-sectional view of an LED package according to another exemplary embodiment.

FIG. 4 is a cross-sectional view of an LED package 400 according to another exemplary embodiment.

The LED package 400 may be the same as the LED package 100 of FIG. 1 and the LED package 300 of FIG. 3 except that a second reflective layer 148 is further formed between the first molding resin layer 130-1 and the second molding resin layer 138-1. Accordingly, a description of features of FIG. 4 that has already been made with reference to FIGS. 1 and 3 may be omitted or briefly mentioned.

The second reflective layer 148 is formed on a surface and two side walls of each of the first electrode pad 126 and the second electrode pad 128 and on the first molding resin layer 130-1 on two side walls of each of the first pillar electrode 132 and the second pillar electrode 134. The second reflective layer 148 may include a metal layer, for example, silver (Ag) or copper (Cu). A distributed Bragg reflector may be used to form the second reflective layer 148. The distributed Bragg reflector may be a multi-layered reflective layer in which a first insulation layer having a first refractive index and a second insulation layer having a second refractive index are alternately stacked.

The second molding resin layer 138-1 is formed on the second reflective layer 148. Accordingly, the second reflective layer 148 may be placed between the first molding resin layer 130-1 and the second molding resin layer 138-1. The second reflective layer 148 may be placed between the first molding resin layer 130-1 and the second molding resin layer 138-1 in the first pad area PD1, the second pad area PD2, and the pad isolating area PDIS.

The LED package 400 as described above may release light emitted from the light-emitting structure 110 to the outside more efficiently as the second reflective layer 148 is placed on the entire surface of the first molding resin layer 130-1. As a result, the LED package 400 may have improved light extraction efficiency.

Figure 5:
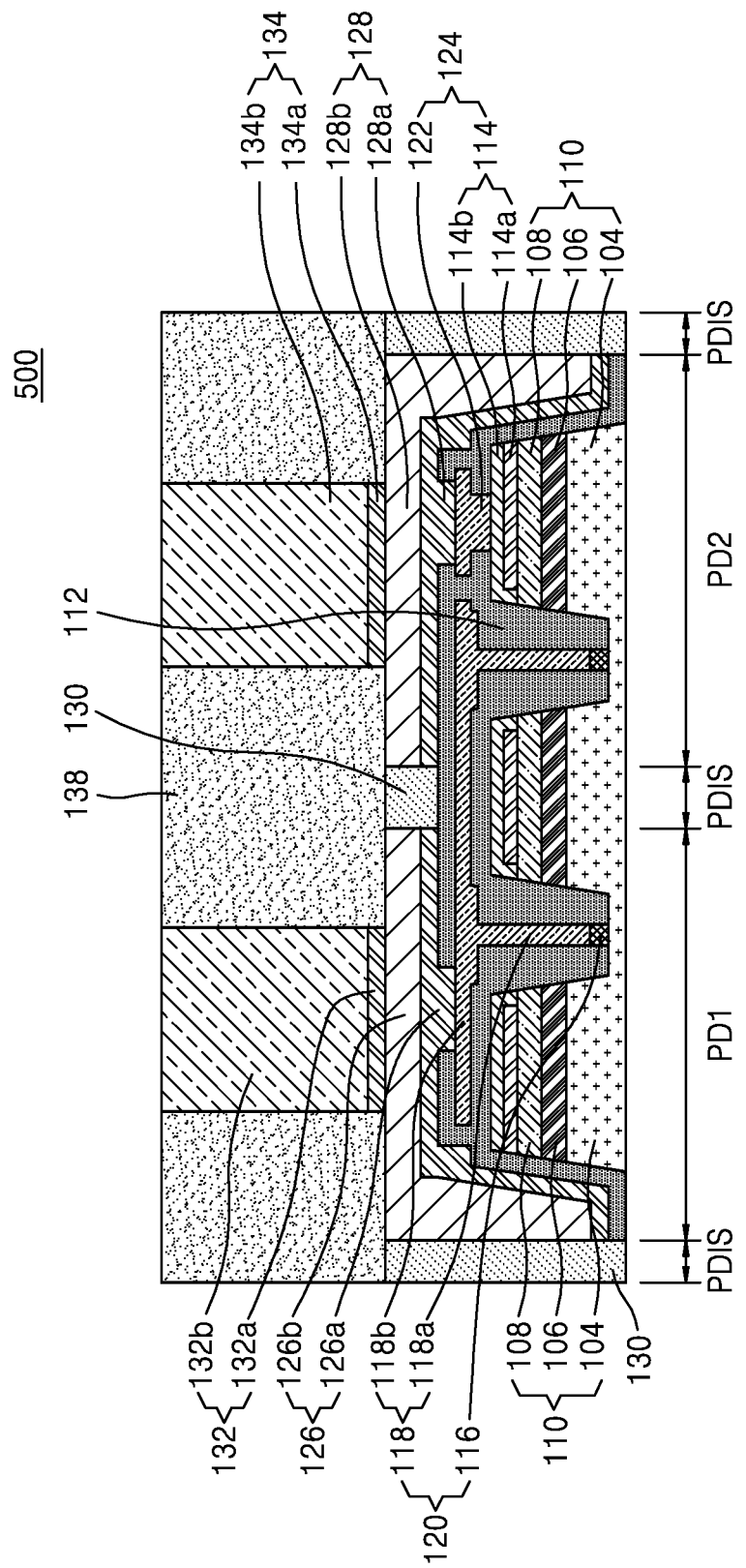
FIG. 5 is a cross-sectional view of an LED package according to another exemplary embodiment.
Figure 6:
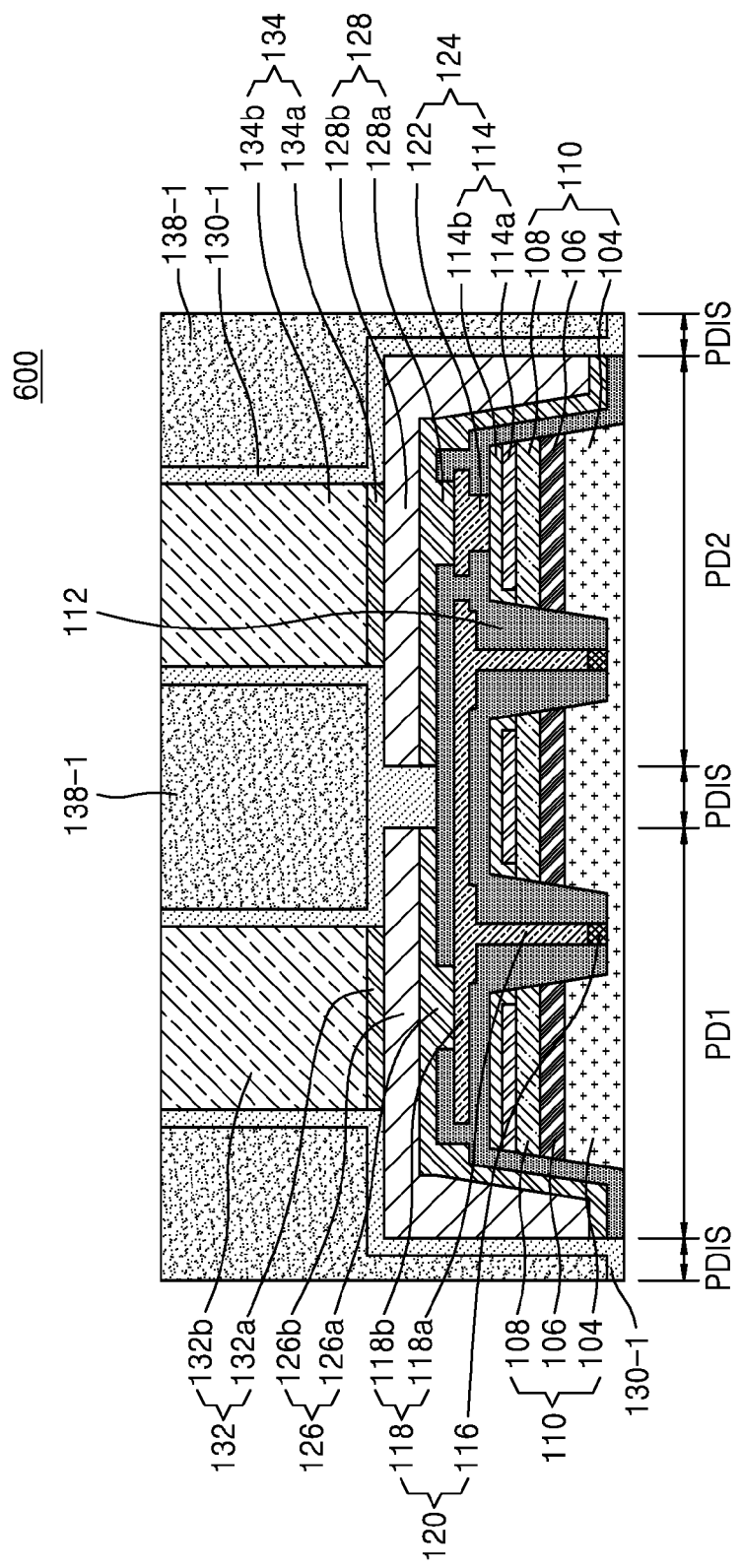
FIG. 6 is a cross-sectional view of an LED package according to another exemplary embodiment.

FIGS. 5 and 6 are cross-sectional views of LED packages 500 and 600 according to other exemplary embodiments.

The LED packages 500 and 600 may be the same as the LED package 100 of FIG. 1 and the LED package 300 of FIG. 3 except that the substrate 102 has been removed from the LED packages 500 and 600. Accordingly, descriptions of features of FIGS. 5 and 6 that have already been made with reference to FIGS. 1 to 3 may be omitted or briefly mentioned.

The LED packages 500 and 600 are obtained by removing the substrate 102 from each of the LED packages 100 and 300 of FIGS. 1 and 3. When the substrate 102 is removed, light emitted from the light-emitting structure 110 may not be absorbed by the substrate 102.

Accordingly, the LED packages 500 and 600 may respectively include the second molding resin layers 138 and 138-1 and thus have improved reliability. Also, the LED packages 500 and 600 may respectively include the first molding resin layers 130 and 130-1 and have no light absorbed into the substrate 102, and thus may have improved light extraction efficiency.

FIGS. 7, 8, 9 and 10 are schematic cross-sectional views of the main operations of a method of manufacturing the LED package 100 of FIG. 1. Descriptions of features of FIGS. 7 to 10 that have already been made with reference to FIG. 1 will be omitted or briefly mentioned.

Figure 7:
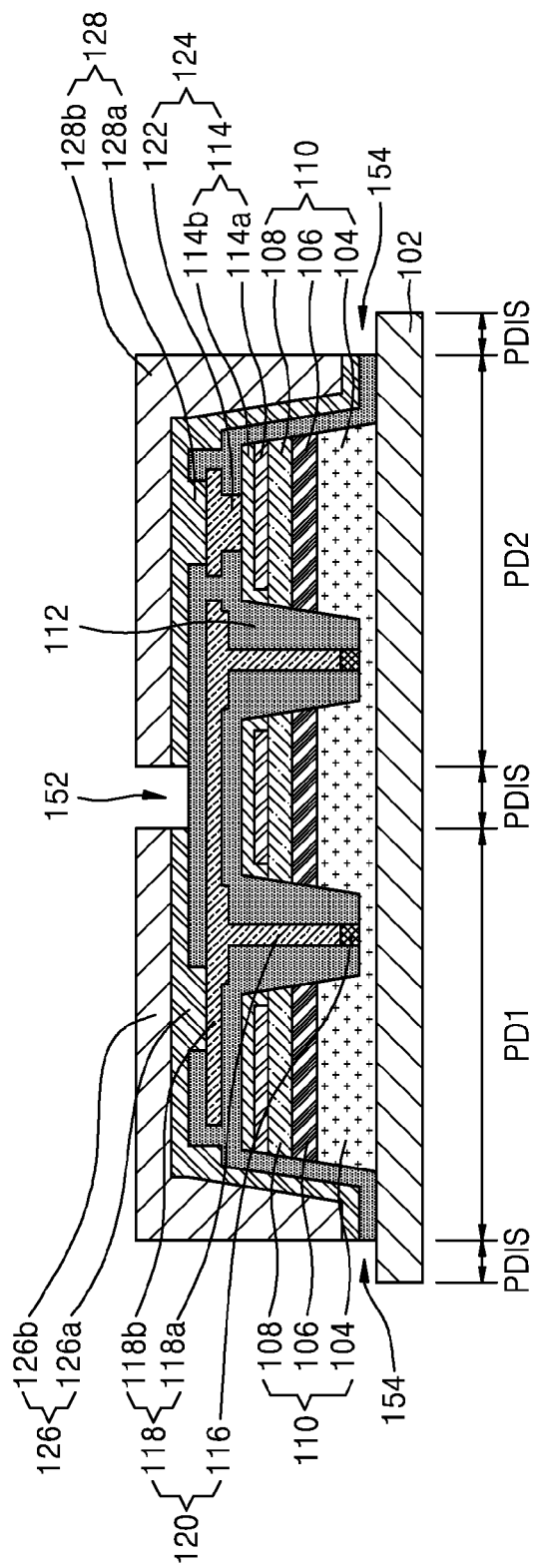
FIGS. 7, 8, 9 and 10 are schematic cross-sectional views of the main operations of a method of manufacturing the LED package of FIG. 1.

Referring to FIG. 7, the light-emitting structure 110 including the first conductive-type semiconductor layer 104, the active layer 106, and the second conductive-type semiconductor layer 108 is formed on the substrate 102. The isolating insulation layer 112 for forming an electrical insulation layer with other elements is formed on two side portions and an upper portion of the light-emitting structure 110.

The first connection electrode portion 120 and the second connection electrode portion 124 electrically connected to the first conductive-type semiconductor layer 104 and the second conductive-type semiconductor layer 108 respectively are formed in the isolating insulation layer 112.

The first connection electrode portion 120 may include the electrode layer 118 including the pole electrode layer 118a penetrating the isolating insulation layer 112 and the first plate electrode layer 118b connected to the pole electrode layer 118a. The first connection electrode portion 120 may include the first contact layer 116 on the first conductive-type semiconductor layer 104 that is below the pole electrode layer 118a.

The second connection electrode portion 124 may include the second plate electrode layer 122 in the isolating insulation layer 112 that is above the second conductive-type semiconductor layer 108. The second connection electrode portion 124 may include the second contact layer 114 on the second conductive-type semiconductor layer 108 that is below the second plate electrode layer 122.

The first electrode pad 126 and the second electrode pad 128 electrically connected to the first connection electrode portion 120 and the second connection electrode portion 124, respectively, are formed on the first and second connection electrode portions 120 and 124 and the isolating insulation layer 112.

The first electrode pad 126 and the second electrode pad 128 may be formed through the following process. A material layer for a pad seed and a material layer for a pad electrically connected to the first plate electrode layer 118b and the second plate electrode layer 122 are formed and then patterned by using a photolithography process to form the first electrode pad 126 and the second electrode pad 128.

Accordingly, the first pad layer 126b and the second pad layer 128b may be respectively formed on the first pad seed layer 126a and the second pad seed layer 128a, and thus, the first electrode pad 126 and the second electrode pad 128 may be provided.

Through the above photolithography process, pad isolating holes 152 and 154 are formed between the first electrode pad 126 and the second electrode pad 128. The pad isolating hole 152 may be a hole in an upper portion of the light-emitting structure 110, and the pad isolating hole 154 may be a hole formed in at two side portions of the light-emitting structure 110.

Figure 8:
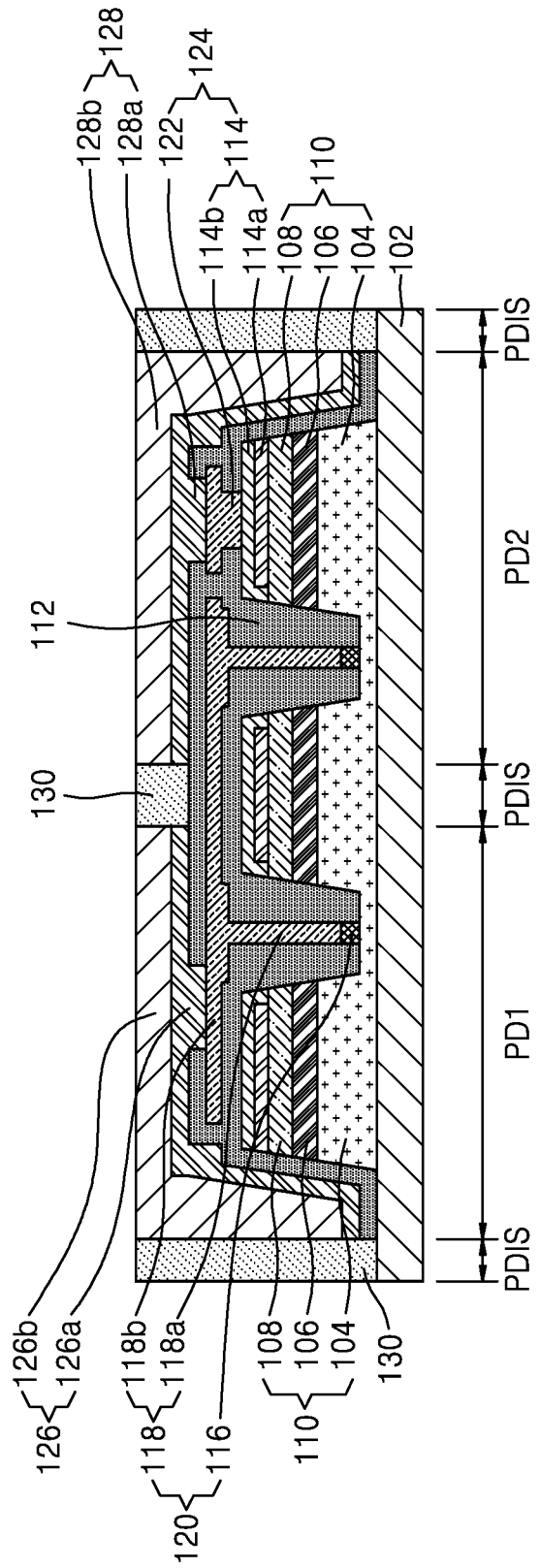

Referring to FIG. 8, the first molding resin layer 130 is formed in the pad isolating hole 154. The first molding resin layer 130 may include a material layer having reflectivity higher than a reflectivity of the second molding resin layer 138 to be formed later. The first molding resin layer 130 may be provided as an encapsulation layer sealing a gap between the first electrode pad 126 and the second electrode pad 128.

The first molding resin layer 130 may include a material having high reflectivity, for example, tungsten or silicon, and thus may have reflectivity higher than a reflectivity of the second molding resin layer 138 of FIG. 1 to be formed later. Due to the first molding resin layer 130, light extraction efficiency of the LED package 100 may be improved.

Figure 9:
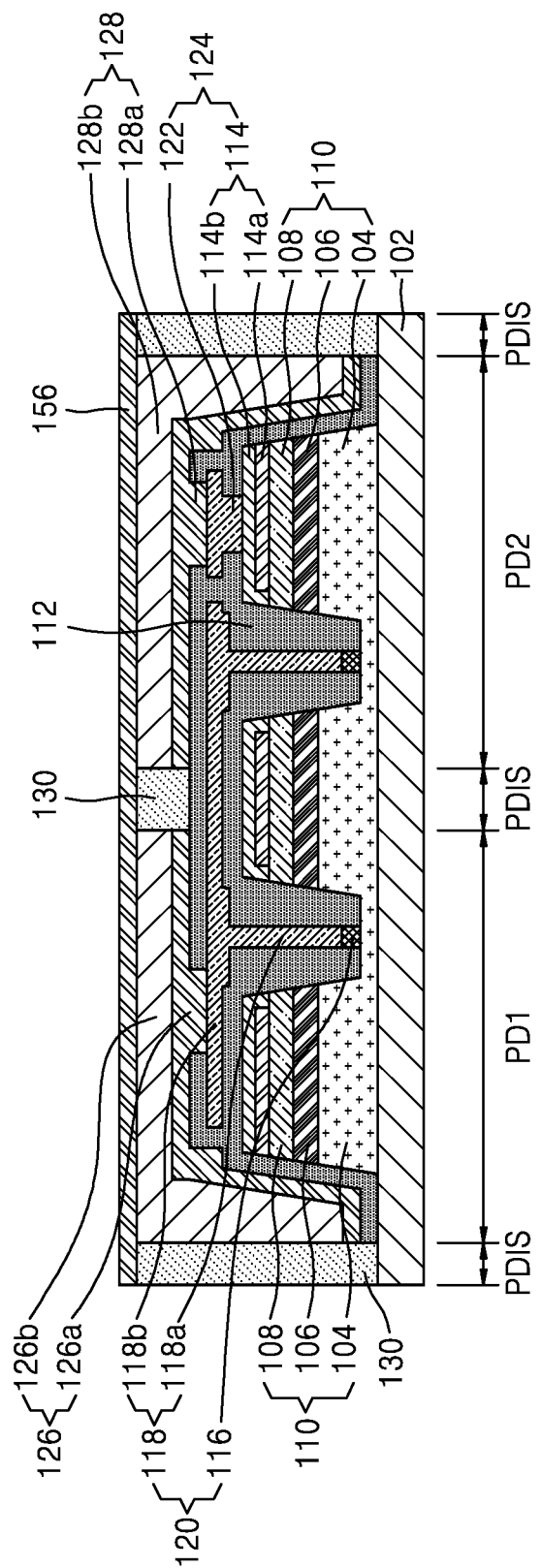
Figure 10:
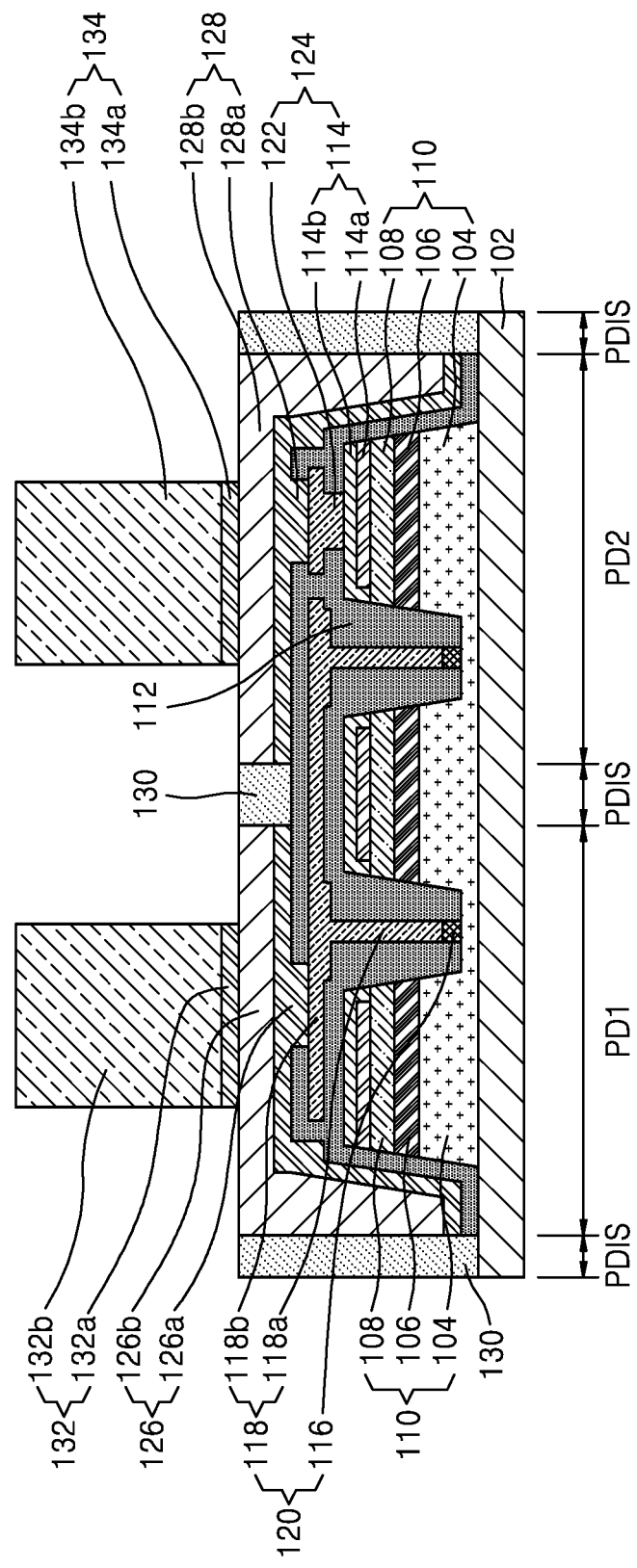

Referring to FIGS. 9 and 10, as illustrated in FIG. 9, a material layer 156 for a pillar seed is formed on the first electrode pad 126, the second electrode pad 128, and the first molding resin layer 130. The material layer 156 for a pillar seed may include a metal layer, for example, a copper layer.

As illustrated in FIG. 10, a material layer for a pillar electrode is formed on the material layer 156 for a pillar seed, and then, the material layer for a pillar electrode and the material layer 156 for a pillar seed are patterned by using the photolithography process to form the first pillar electrode 132 and the second pillar electrode 134. The material layer for a pillar electrode may include a metal layer, for example, a copper layer.

The first pillar electrode 132 may include the first pillar seed layer 132a and the first pillar layer 132b. The second pillar electrode 134 may include the second pillar seed layer 134a and the second pillar layer 134b. As a result, the first pillar seed layer 132a, the second pillar seed layer 134a, the first pillar layer 132b, and the second pillar layer 134b may include metal layers, for example, copper layers.

Next, as illustrated in FIG. 1, on the first molding resin layer 130, the first electrode pad 126, and the second electrode pad 128, the second molding resin layer 138 is formed between the first pillar electrode 132 and the second pillar electrode 134. The second molding resin layer 138 may be formed by forming a molding material layer between the first pillar electrode 132 and the second pillar electrode 134 and then grinding a surface of the molding material layer. The second molding resin layer 138 may be an encapsulation layer sealing a gap between the first pillar electrode 132 and the second pillar electrode 134. The second molding resin layer 138 may include a material more reliable in wetting, tolerance, strength, and the like, compared to the first molding resin layer 130. Through the process as described above, the LED package 100 of FIG. 1 may be completed.

Figure 11:
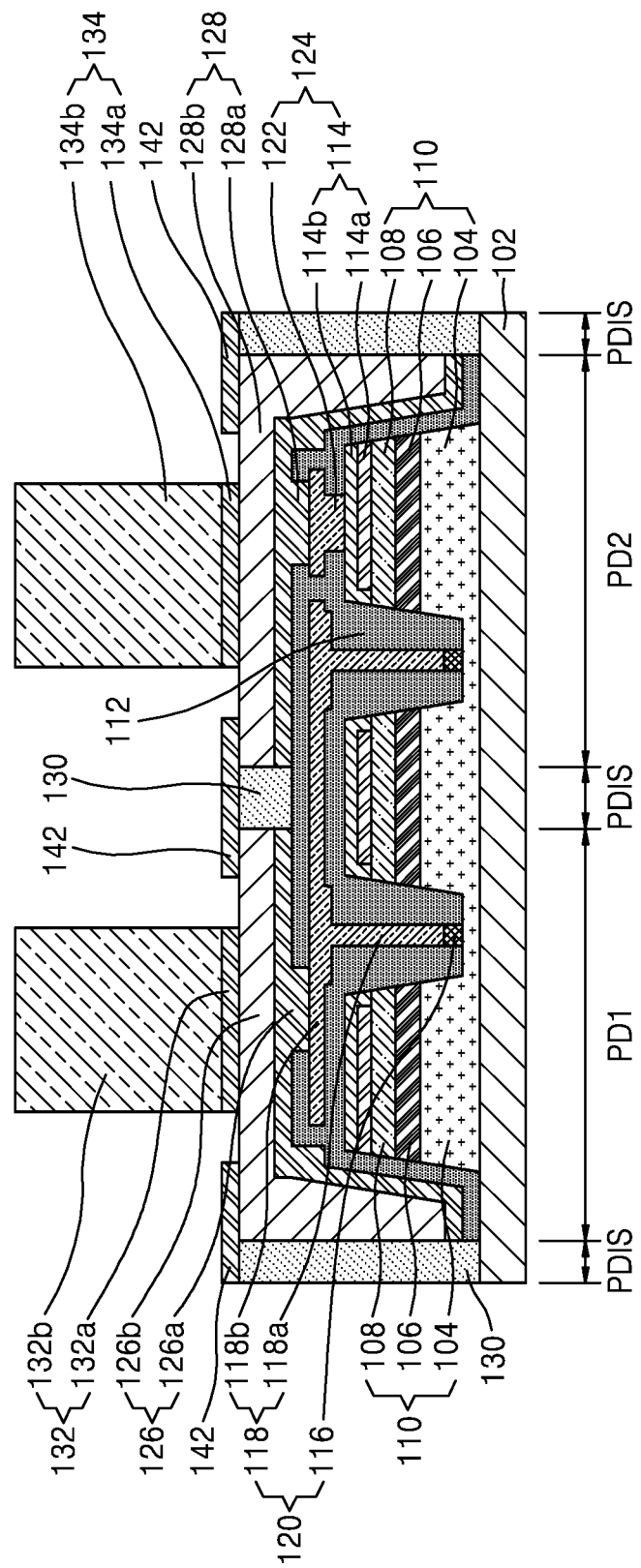
FIG. 11 is a cross-sectional view for describing a method of manufacturing the LED package of FIG. 2.

FIG. 11 is a cross-sectional view for describing a method of manufacturing the LED package 200 of FIG. 2.

The manufacturing method of FIG. 11 may be the same as the method of FIGS. 7 to 9 except for a process of forming the first reflective layer 142. Accordingly, a description of features of FIG. 11 that has already been made with reference to FIGS. 7 to 10 will be omitted or briefly mentioned.

As illustrated in FIGS. 9 to 11, when the material layer 156 for a pillar seed and a material layer for a pillar electrode are formed on the first electrode pad 126, the second electrode pad 128, and the first molding resin layer 130, and then patterned by using the photolithography process, the first reflective layer 142 is formed as well as the first pillar electrode 132 and the second pillar electrode 134.

The first reflective layer 142 may be formed on the first molding resin layer 130. The first reflective layer 142 may include the same material as the pillar seed layers 132a and 132b. The first reflective layer 142 may include a metal layer, for example, a copper layer.

Figure 12:
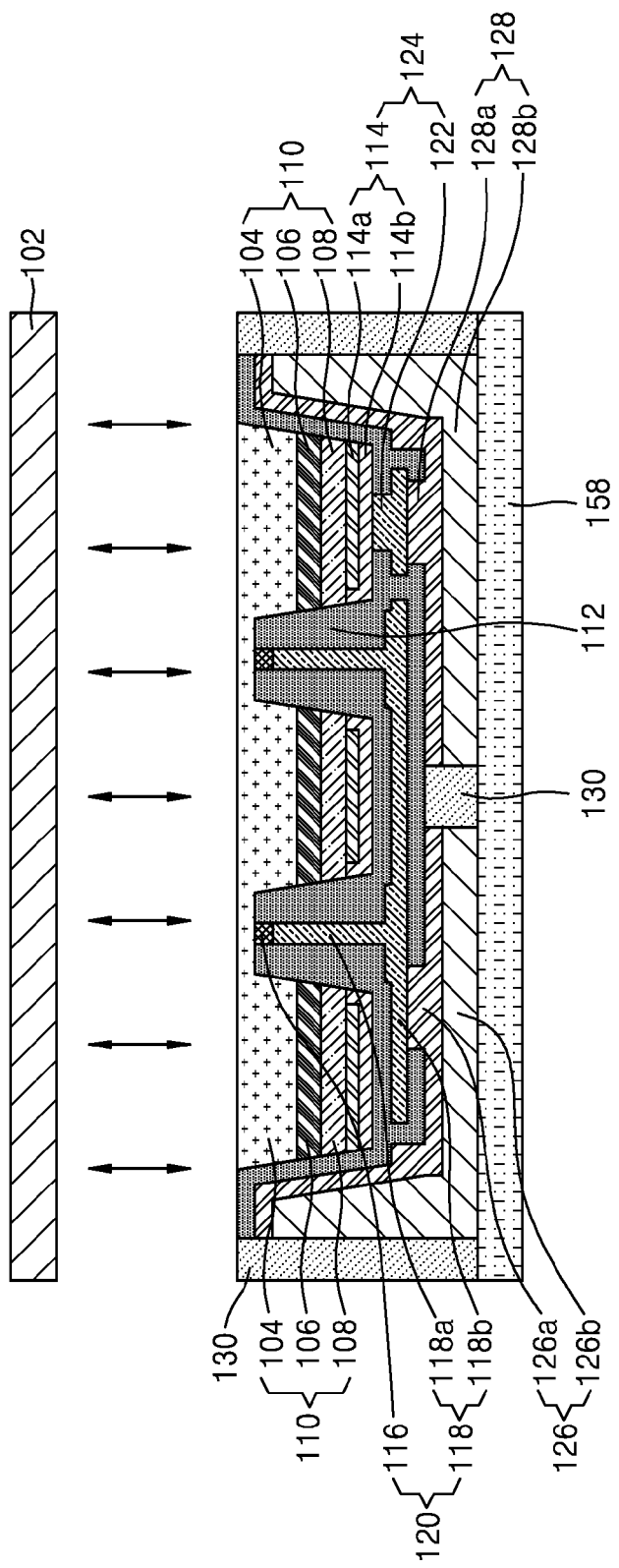
FIG. 12 is a cross-sectional view for describing a method of manufacturing the LED package of FIG. 5.

FIG. 12 is a cross-sectional view for describing a method of manufacturing the LED package 500 of FIG. 5.

The manufacturing method of FIG. 12 may be the same as the method of FIGS. 7 to 9 except for a process of removing the substrate 102. Accordingly, a description of features of FIG. 12 that has already been made with reference to FIGS. 7 to 10 will be omitted or briefly mentioned.

The manufacturing process of FIGS. 7 and 8 is performed. As illustrated in FIG. 7, the light-emitting structure 110 including the first conductive-type semiconductor layer 104, the active layer 106, and the second conductive-type semiconductor layer 108, the isolating insulation layer 112, the first connection electrode portion 120, the second connection electrode portion 124, the first electrode pad 126, and the second electrode pad 128 are formed on the substrate 102. Next, as illustrated in FIG. 8, the first molding resin layer 130 sealing a gap between the first electrode pad 126 and the second electrode pad 128 is formed.

As illustrated in FIG. 12, the first electrode pad 126, the second electrode pad 128, and the first molding resin layer 130 are attached to a supporting carrier 158 turned upside down. Next, the substrate 102 on an upper portion of the supporting carrier 158 is removed.

The supporting carrier 158 is removed, and then, as illustrated in FIGS. 9 and 10, the first pillar electrode 132 and the second pillar electrode 134 are formed on the first electrode pad 126 and the second electrode pad 128.

Next, as illustrated in FIG. 5, on the first molding resin layer 130, the first electrode pad 126, and the second electrode pad 128, the second molding resin layer 138 may be formed between the first pillar electrode 132 and the second pillar electrode 134, and thus, the LED package 500 may be completed.

Figure 13:
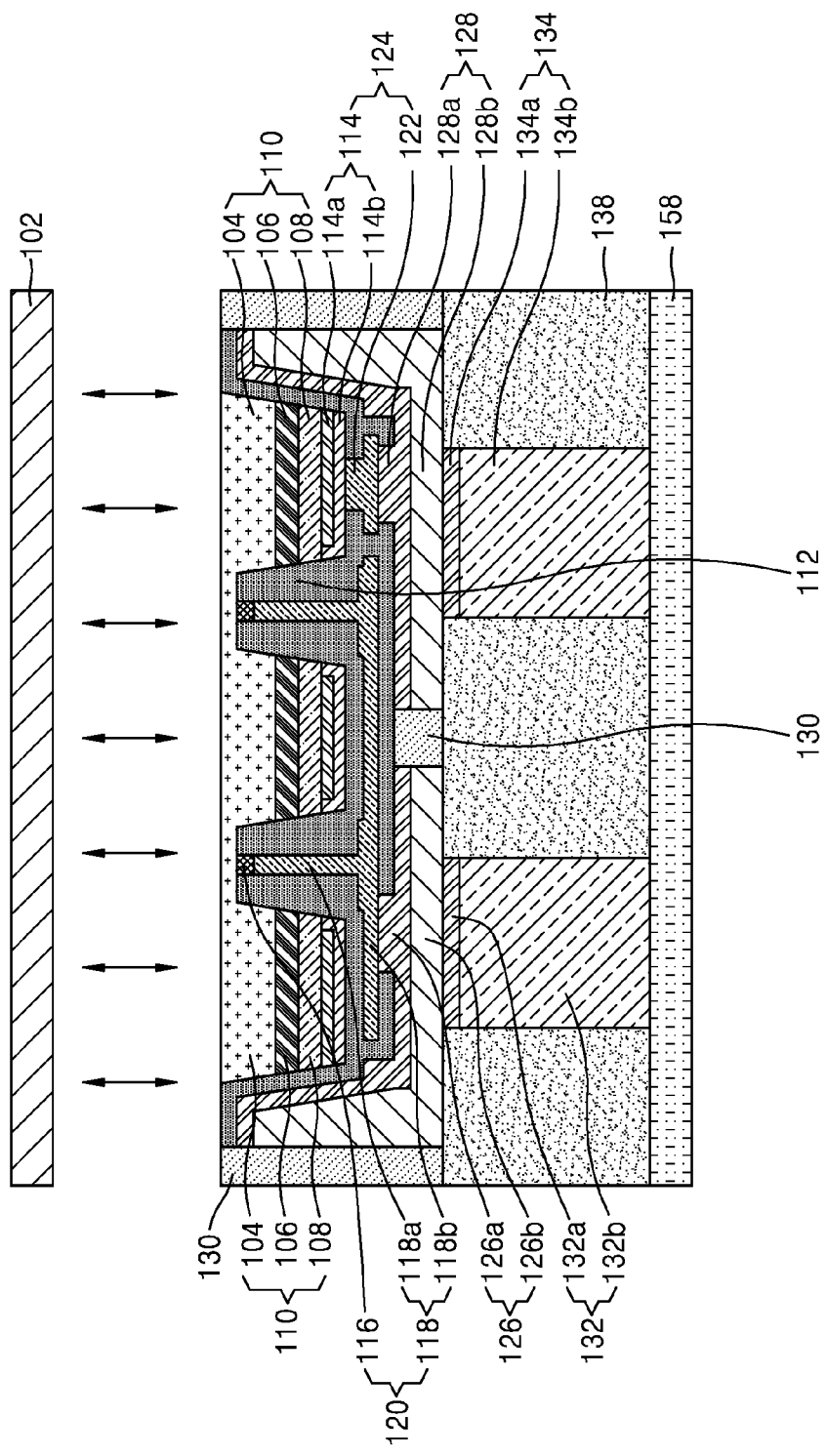
FIG. 13 is a cross-sectional view for describing a method of manufacturing the LED package of FIG. 5.

FIG. 13 is a cross-sectional view for describing a method of manufacturing the LED package 500 of FIG. 5.

The manufacturing method of FIG. 13 may be the same as the method of FIGS. 7 to 9 except for a process of removing the substrate 102. Accordingly, a description of features of FIG. 13 that has already been made with reference to FIGS. 7 to 10 may be omitted or briefly mentioned.

The manufacturing process of FIGS. 7 to 10 is performed. Also, as illustrated in FIG. 5, on the first molding resin layer 130, the first electrode pad 126, and the second electrode pad 128, the second molding resin layer 138 is formed between the first pillar electrode 132 and the second pillar electrode 134.

As illustrated in FIG. 13, the first pillar electrode 132, the second pillar electrode 134, and the second molding resin layer 138 are attached to the supporting carrier 158 turned upside down. Next, the substrate 102 on an upper portion of the supporting carrier 158 is removed, and then, the supporting carrier 158 is removed. Thus, the LED package 500 may be completed.

Figure 14:
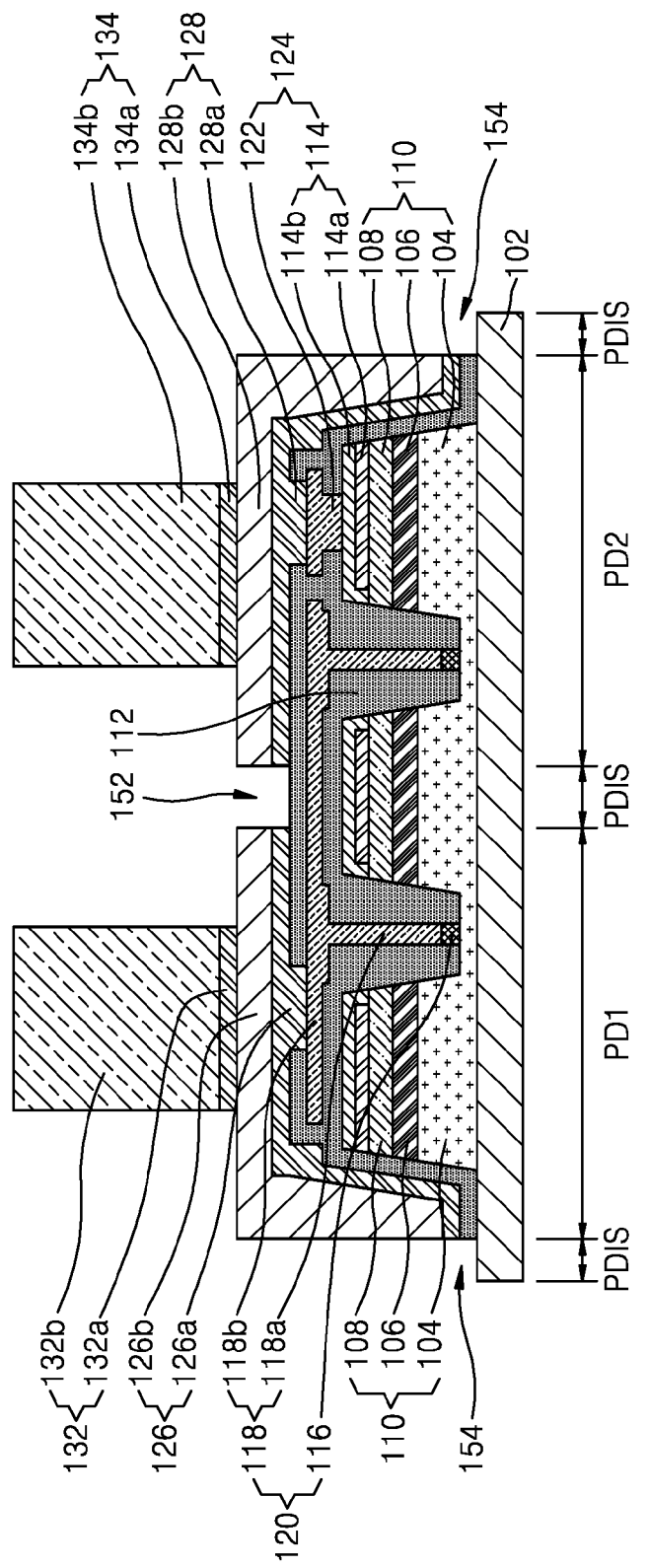
FIGS. 14 and 15 are schematic cross-sectional views of the main operations of a method of manufacturing the LED package of FIG. 3.
Figure 15:
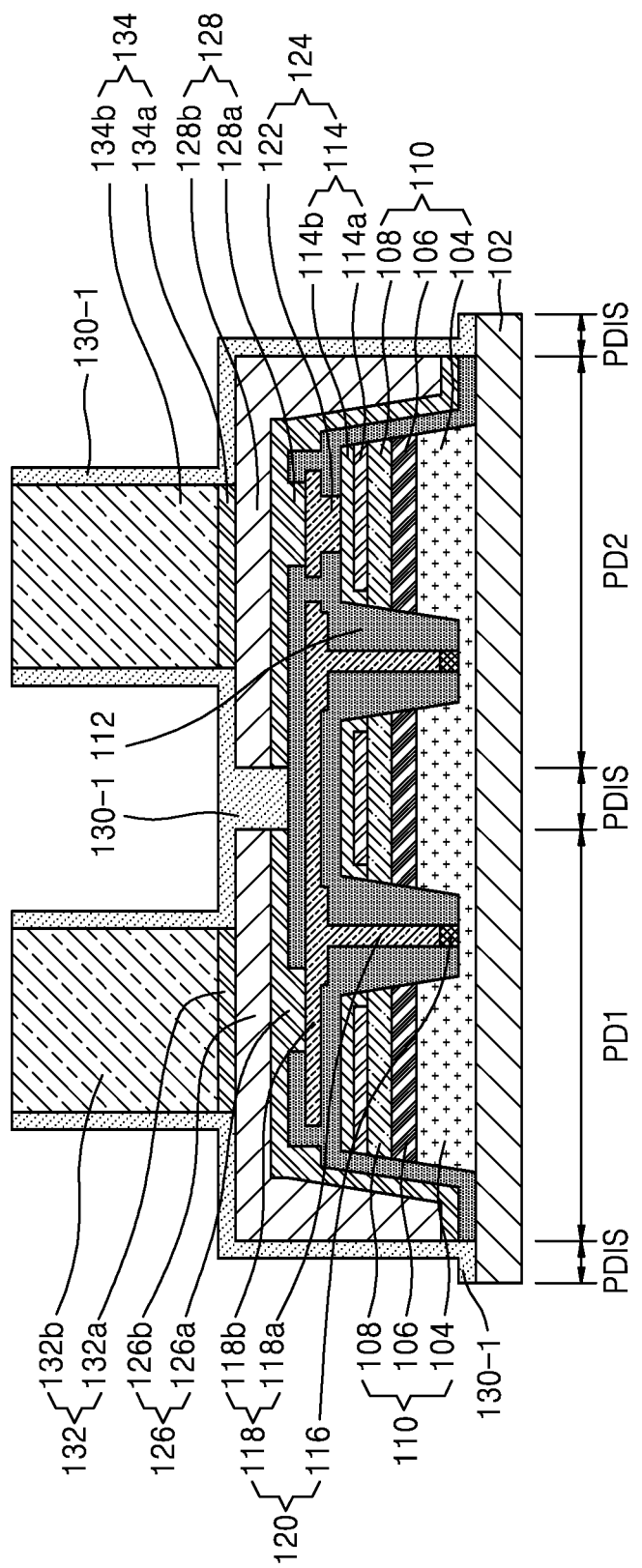

FIGS. 14 and 15 are schematic cross-sectional views of the main operations of a method of manufacturing the LED package 300 of FIG. 3. Descriptions of features of FIGS. 14 and 15 that have already been made with reference to FIGS. 7 to 10 will be omitted or briefly mentioned.

As described above in FIG. 7, the light-emitting structure 110 including the first conductive-type semiconductor layer 104, the active layer 106, and the second conductive-type semiconductor layer 108, the isolating insulation layer 112, the first connection electrode portion 120, and the second connection electrode portion 124 are formed on the substrate 102.

Also, the first electrode pad 126 and the second electrode pad 128 electrically connected to the first connection electrode portion 120 and the second connection electrode portion 124, respectively, are formed. The pad isolating holes 152 and 154 are formed between the first electrode pad 126 and the second electrode pad 128. The pad isolating hole 152 may be a hole in an upper portion of the light-emitting structure 110, and the pad isolating hole 154 may be a hole at two side portions of the light-emitting structure 110.

As illustrated in FIG. 14, the first pillar electrode 132 and the second pillar electrode 134 are respectively formed on the first electrode pad 126 and the second electrode pad 128. As described above, the first pillar electrode 132 may include the first pillar seed layer 132a and the first pillar layer 132b. The second pillar electrode 134 may include the second pillar seed layer 134a and the second pillar layer 134b.

As illustrated in FIG. 15, the first molding resin layer 130-1 is formed on the entire surfaces of the first electrode pad 126, the second electrode pad 128, the first pillar electrode 132, and the second pillar electrode 134 and the entire surfaces of the pad isolating holes 152 and 154. The first molding resin layer 130-1 may be a coating resin layer coated in a spray form. The first molding resin layer 130-1 may include a material having reflectivity higher than a reflectivity of the second molding resin layer 138-1 to be formed later.

As described above, the first molding resin layer 130-1 is formed on a surface and two side walls of each of the first electrode pad 126 and the second electrode pad 128. The first molding resin layer 130-1 is formed on two side walls of each of the first pillar electrode 132 and the second pillar electrode 134. The first molding resin layer 130-1 is formed between the first pillar electrode 132 and the second pillar electrode 134.

Although FIG. 15 illustrates that the first molding resin layer 130-1 fills the pad isolating hole 152 on the upper portion of the light-emitting structure 110, the pad isolating hole 152 may not be filled depending on the size of the pad isolating hole 152.

Next, as illustrated in FIG. 3, the second molding resin layer 138-1 is formed on the first molding resin layer 130-1, the first pillar electrode 132, and the second pillar electrode 134. The second molding resin layer 138-1 may be formed by forming a molding material layer between the first pillar electrode 132 and the second pillar electrode 134 and grinding a surface of the molding material layer.

The second molding resin layer 138-1 may be formed between the first pillar electrode 132 and the second pillar electrode 134 including the first molding resin layer 130-1 on side walls of the first pillar electrode 132 and the second pillar electrode 134. The second molding resin layer 138-1 may be formed on the first molding resin layer 130-1 on side walls of the first electrode pad 126 and the second electrode pad 128. The second molding resin layer 138-1 may include a material having higher reliability compared to the first molding resin layer 130-1. Through the manufacturing process as described above, the LED package 300 is completed.

Figure 16:
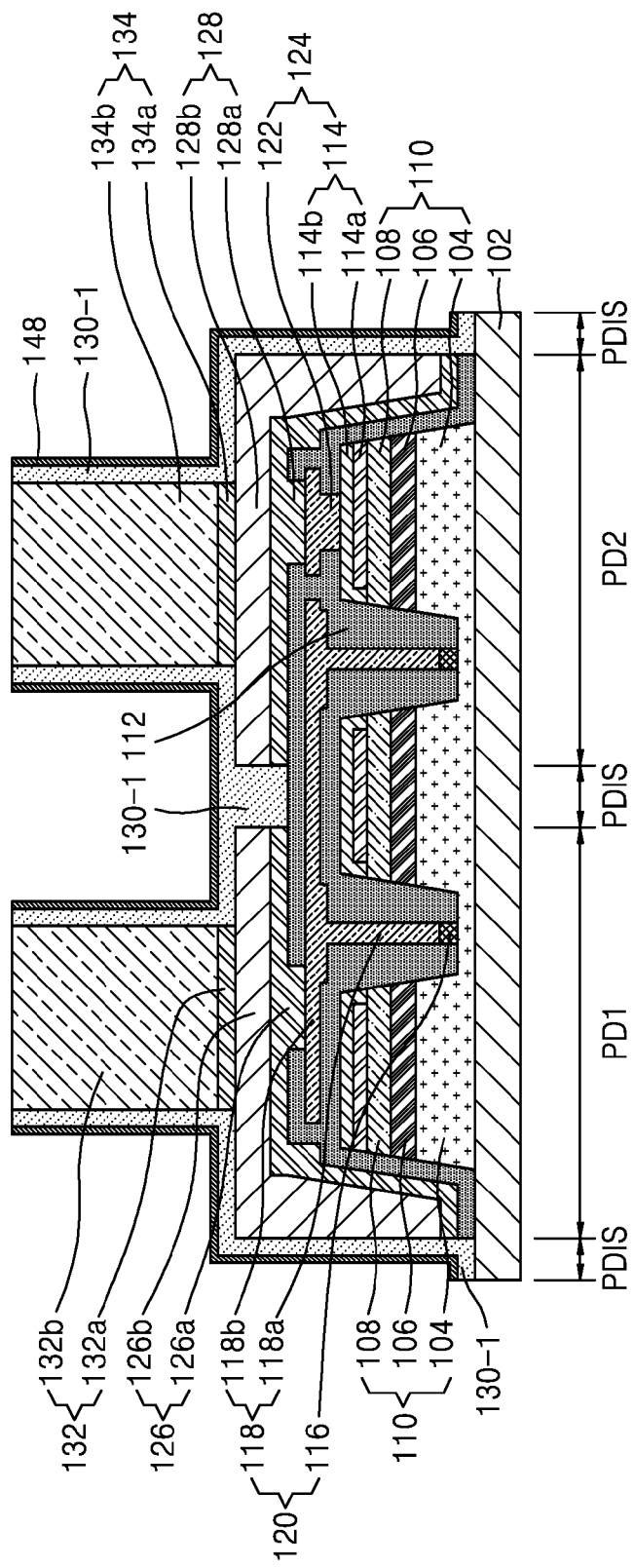
FIG. 16 is a cross-sectional view for describing a method of manufacturing the LED package of FIG. 4.

FIG. 16 is a cross-sectional view for describing a method of manufacturing the LED package 400 of FIG. 4.

The manufacturing method of FIG. 16 may be the same as the method of FIGS. 14 and 15 except for a process of forming the second reflective layer 148. Accordingly, a description of features of FIG. 16 that has already been made with reference to FIGS. 14 and 15 will be omitted or briefly mentioned.

As illustrated above in FIG. 14, the first pillar electrode 132 and the second pillar electrode 134 are respectively formed on the first electrode pad 126 and the second electrode pad 128. As illustrated in FIG. 15, the first molding resin layer 130-1 is formed on the entire surfaces of the first electrode pad 126, the second electrode pad 128, the first pillar electrode 132, and the second pillar electrode 134 and the entire surfaces of the pad isolating holes 152 and 154.

As illustrated in FIG. 16, the second reflective layer 148 is formed on the first molding resin layer 130-1. The second reflective layer 148 may be formed on a surface and two side walls of each of the first electrode pad 126 and the second electrode pad 128 and on the first molding resin layer 130-1 on two side walls of each of the first pillar electrode 132 and the second pillar electrode 134.

As illustrated in FIG. 4, the second molding resin layer 138-1 is formed on the second reflective layer 148 to fill a gap between the first electrode pad 126 and the second electrode pad 128. The second molding resin layer 138-1 is formed to fill a gap between the first pillar electrode 132 and the second pillar electrode 134. Accordingly, the second reflective layer 148 may be placed between the first molding resin layer 130-1 and the second molding resin layer 138-1. Through the manufacturing process as described above, the LED package 400 may be completed.

Figure 17:
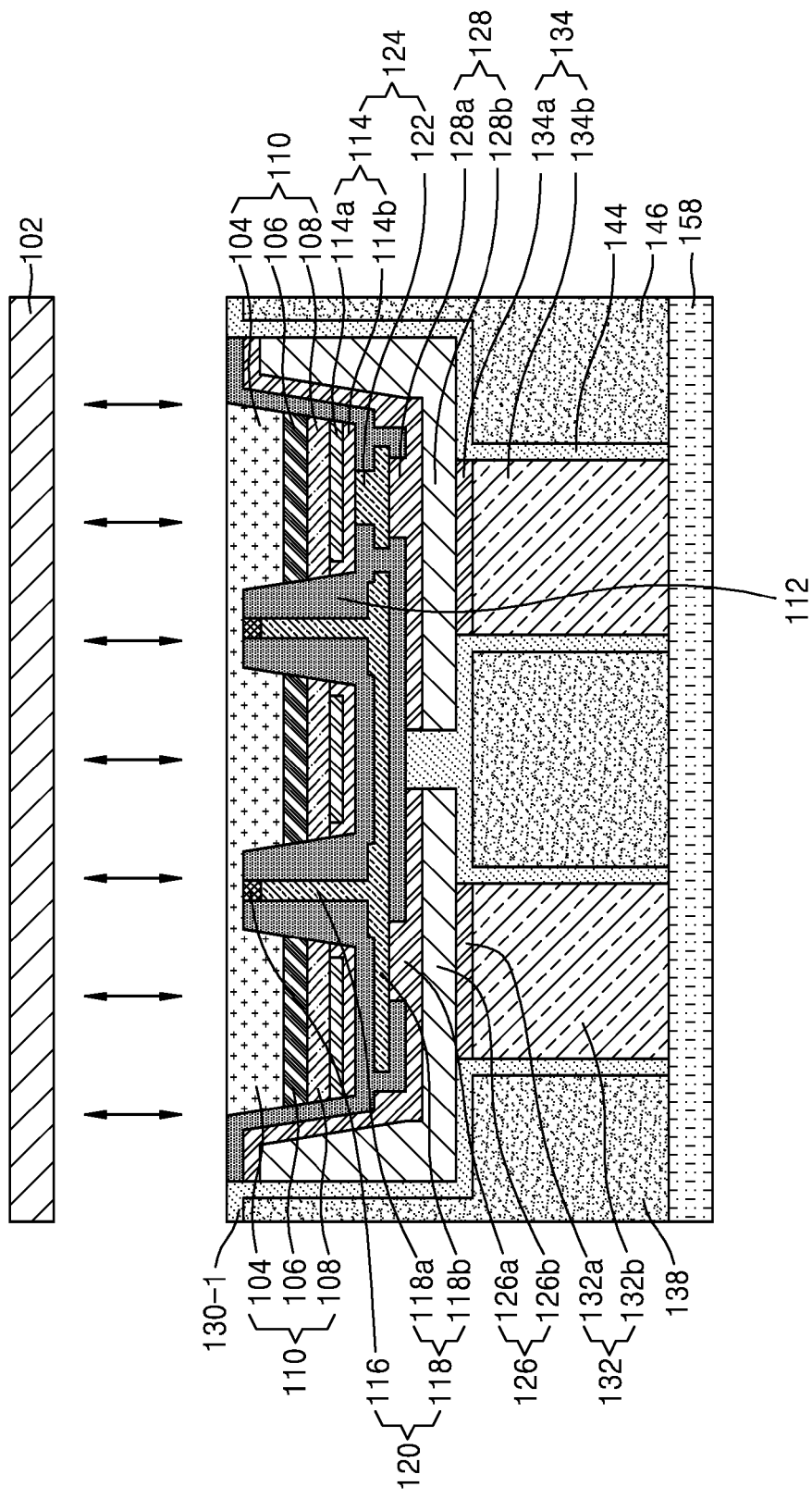
FIG. 17 is a cross-sectional view for describing a method of manufacturing the LED package of FIG. 6.

FIG. 17 is a cross-sectional view for describing a method of manufacturing the LED package 600 of FIG. 6.

The manufacturing method of FIG. 17 may be the same as the method of FIGS. 14 and 15 except for a process of removing the substrate 102. Accordingly, a description of features of FIG. 17 that has already been made with reference to FIGS. 14 and 15 will be omitted or briefly mentioned.

The manufacturing process of FIGS. 14 and 15 is performed. Also, as illustrated in FIG. 3, on the first molding resin layer 130-1, the first electrode pad 126, and the second electrode pad 128, the second molding resin layer 138-1 is formed between the first pillar electrode 132 and the second pillar electrode 134.

As illustrated in FIG. 17, the first pillar electrode 132, the second pillar electrode 134, and the second molding resin layer 138-1 are attached to the supporting carrier 158 turned upside down. Next, the substrate 102 on an upper portion of the supporting carrier 158 is removed, and then, the supporting carrier 158 is removed. Thus, the LED package 600 may be completed.

Figure 18:
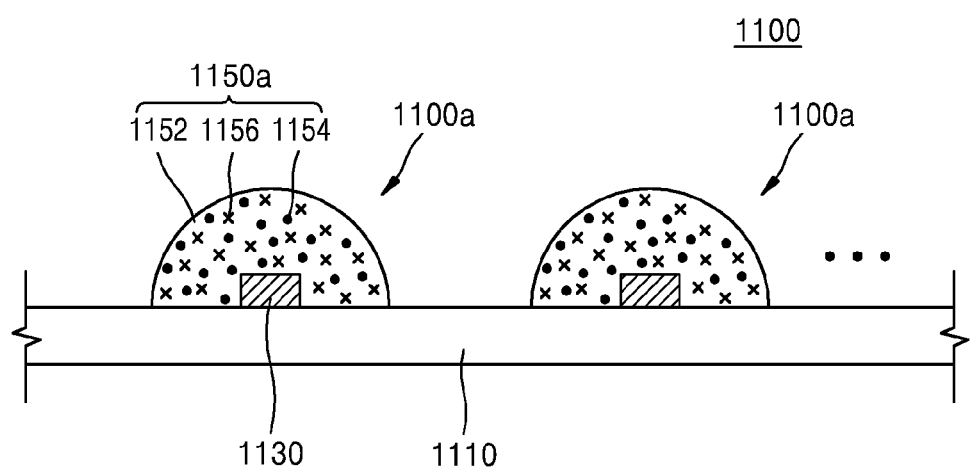
FIGS. 18 and 19 are schematic cross-sectional views of white light source modules including an LED package, according to exemplary embodiments.
Figure 19:
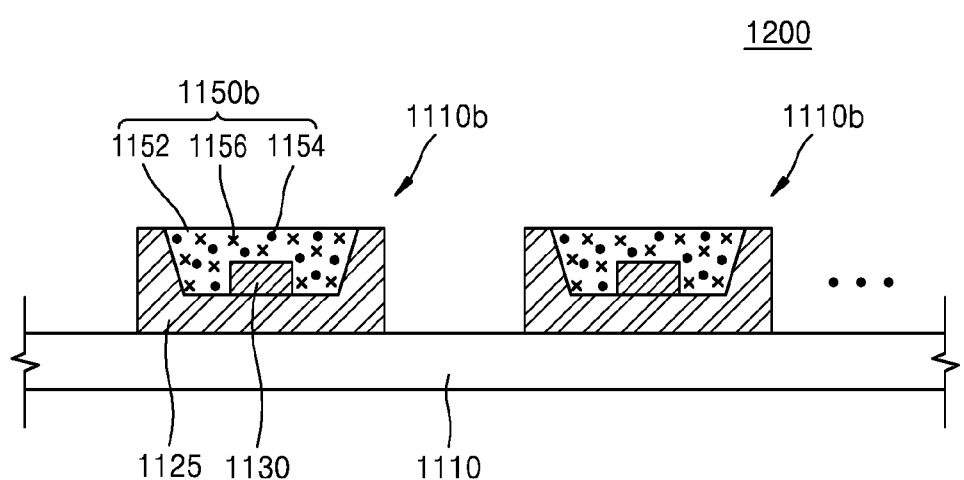

FIGS. 18 and 19 are schematic cross-sectional views of white light source modules 1100 and 1200 including an LED package, according to exemplary embodiments.

Referring to FIG. 18, the light source module 1100 for an LCD backlight may include a circuit board 1110 and an array of a plurality of white light-emitting devices 1100*a* mounted on the circuit board 1110. Conductive patterns connected to the white light-emitting devices 1100*a* may be formed on the circuit board 1110.

Each of the white light-emitting devices 1100*a* may be configured such that a light-emitting device 1130 configured to emit blue light is directly mounted on the circuit board 1110 by using a chip on board (COB) method. The light-emitting device 1130 may be at least one of the above-described LED packages 100 to 600 according to exemplary embodiments. Each of the white light-emitting devices 1100*a* may exhibit a wide orientation angle because a wavelength conversion unit (also referred to as a wavelength conversion layer) 1150*a* is formed to have a semispherical shape with a lens function. The wide orientation angle may contribute to reducing a thickness or a width of an LCD display.

Referring to FIG. 19, the light source module 1200 for an LCD backlight may include a circuit board 1110 and an array of a plurality of white light-emitting devices 1100*b* mounted on the circuit board 1110. Each of the white light-emitting devices 1100*b* may include a blue light-emitting device 1130 mounted in a reflection cup of a package body 1125, and a wavelength conversion unit 1150*b* that encapsulates the blue light-emitting device 1130. The light-emitting device 1130 may be at least one of the above-described LED packages 100 to 600 according to exemplary embodiments.

When necessary or desired, the wavelength conversion units 1150*a* and 1150*b* may include wavelength conversion materials 1152, 1154, and 1156 such as phosphors and/or quantum dots. The wavelength conversion materials will be described below in detail.

Figure 20A:
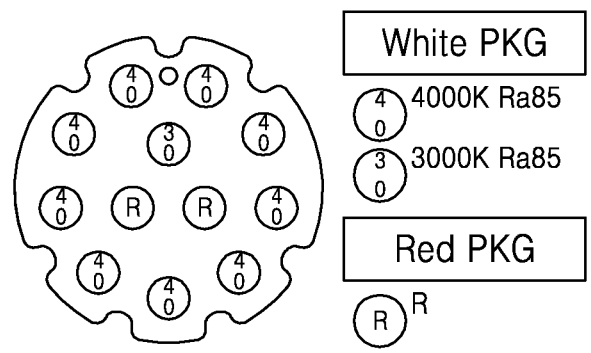
FIGS. 20A and 20B are schematic cross-sectional view of a white light source module, which is adoptable in a lighting apparatus as an LED package, according to an exemplary embodiment.
Figure 20B:
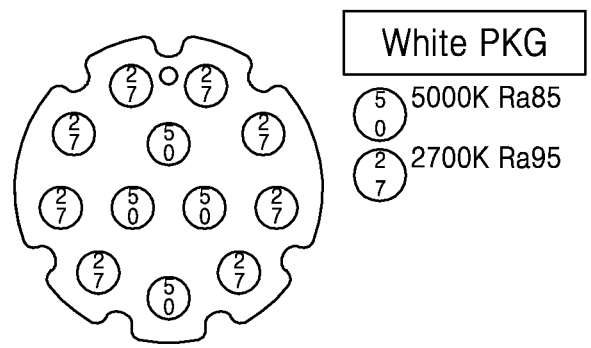
Figure 21:
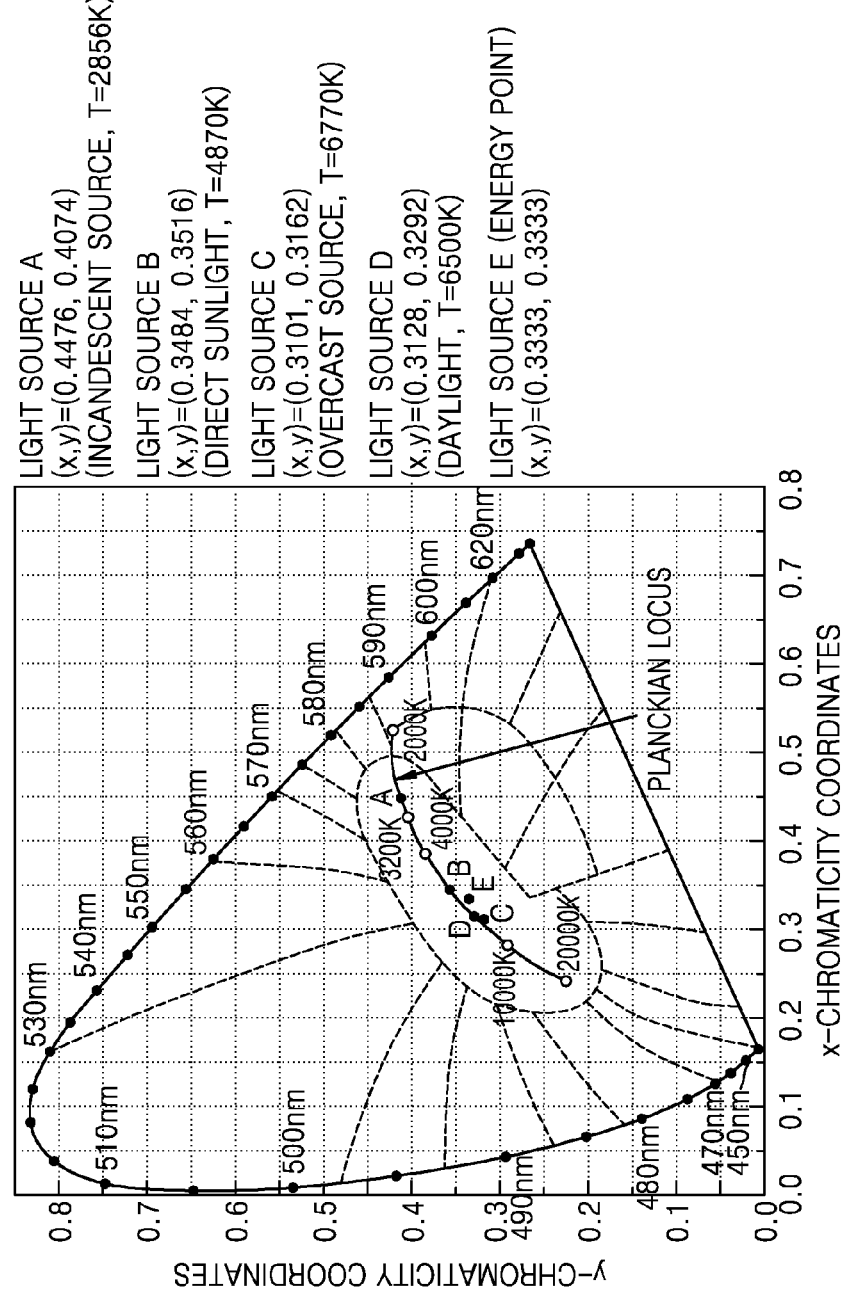
FIG. 21 is a CIE chromaticity diagram illustrating a perfect radiator spectrum that is usable for an LED package manufactured according to one or more exemplary embodiments.

FIGS. 20A and 20B are schematic cross-sectional views of a white light source module, which may be implemented in a lighting apparatus as an LED package, according to an exemplary embodiment, and FIG. 21 is a CIE chromaticity diagram illustrating a perfect radiator spectrum that is usable for an LED package manufactured according to one or more exemplary embodiments.

Specifically, each of the light source modules illustrated in FIGS. 20A and 20B may include a plurality of LED packages 30, 40, R, 27, and 50 mounted on a circuit board. Each of the LED packages 30, 40, R, 27, and 50 may be implemented as at least one of the above-described LED packages 100 to 600 according to exemplary embodiments. A plurality of LED packages mounted on one light source module may be the same type of packages that generate light having the same wavelength. However, as in the present exemplary embodiment, the plurality of LED packages may also be different types of packages that generate light having different wavelengths.

Referring to FIG. 20A, the white light source module may include a combination of the white LED packages 40 and 30 having a color temperature of 4,000K and 3,0000K, respectively, and the red LED package R. The white light source module may adjust a color temperature in the range of about 3,000K and about 4,000K and provide white light having a color rendering index (CRI) Ra of about 85 to about 100. It is understood, however, that exemplary embodiments are not limited to any particular color temperature or CRI Ra.

According to another exemplary embodiment, the white light source module includes only white LED packages, but some packages may include white light having different color temperatures. For example, as illustrated in FIG. 20B, it is possible to adjust a color temperature in the range of about 2,700K to about 5,000K and provide white light having a CRI Ra of about 85 to about 99 by combining the white LED package 27 having a color temperature of about 2,700K and the white LED package 50 having a color temperature of about 5,000K. The number of LED packages for each color temperature may be changed according to a basic color temperature setting value. For example, in a lighting apparatus, of which a basic color temperature setting value is around a color temperature of 4,000K, the number of packages corresponding to a color temperature of 4,000K may be larger than the number of packages corresponding to a color temperature of 3,000K or the number of red LED packages.

As such, different types of LED packages may be configured to include at least one of an LED emitting white light by combining a yellow, green, red, or orange-color phosphor in a blue LED, and a violet, blue, green, red, or infrared LED and adjust a color temperature and a CRI of the white light.

The single LED package may determine light of a desired color according to a wavelength of an LED chip and a type and a combination ratio of phosphors. Also, in the case of white light, the color temperature and the CRI may be adjusted.

For example, when the LED chip emits blue light, the LED package including at least one of the yellow, green, and red phosphors may be configured to emit white light having various color temperatures according to a combination ratio of the phosphors. In contrast, the LED package may be configured to emit green or red light by applying green or red phosphor to the blue LED chip. The color temperature and the CRI of the white light may be adjusted by combining the LED package emitting the white light and the LED package emitting the green or red light. In addition, the LED package may include at least one of LEDs emitting the violet, blue, green, red, and infrared light In this case, the lighting apparatus may adjust the CRI to a photovoltaic level in a sodium (Na) lamp. In addition, the lighting apparatus may generate a variety of white light having a color temperature of about 1,500K to about 20,000K. When necessary or desired, the lighting apparatus may adjust an illumination color according to a surrounding atmosphere or a mood by generating infrared light or visible light such as violet, blue, green, red, or orange color light. In addition, the lighting apparatus may generate light having a specific wavelength so as to promote the growth of plants or to perform any of numerous other types of functions which depend on particular wavelengths of light.

The white light, which is generated by the combination of the yellow, green and red phosphors and/or the green and red LEDs in the blue LED, has two or more peak wavelengths. As illustrated in FIG. 21, (x, y) coordinates of the white light in the CIE 1931 coordinate system may be positioned within a line segment connecting coordinates (0.4476, 0.4074), (0.3484, 0.3516), (0.3101, 0.3162), (0.3128, 0.3292), and (0.3333, 0.3333). Alternatively, the (x, y) coordinates may be positioned in a region surrounded by the line segment and a black-body radiator spectrum. The color temperature of the white light is in the range of about 1,500K to about 20,000K. In FIG. 21, since the white light around point E (0.3333, 0.3333) under the black-body radiator spectrum (Planckian locus) is relatively weak in the light of the yellow-based component, it may be used as an illumination light source in a region in which a user may have a more vivid or fresh feeling than naked eyes. Therefore, an illumination product using the white light around point E (0.3333, 0.3333) under the black-body radiator spectrum (Planckian locus) may be suitable as lighting for certain situations, such as for stores (e.g., shopping malls) that sell groceries and clothes.

On the other hand, various materials, such as phosphors and/or quantum dots, may be used as a material for converting a wavelength of light emitted by the semiconductor LED.

The phosphor may have the following empirical formulas and colors.

Oxide-based: yellow and green color $Y_3Al_5O_{12}$:Ce, $Tb_3Al_5O_{12}$:Ce, $Lu_3Al_5O_{12}$:Ce Silicate-based: yellow color and green color $(Ba,Sr)_2SiO_4$:Eu, yellow color and orange color $(Ba,Sr)_3SiO_5$:Ce Nitride-based: green color β-SiAlON:Eu, yellow color $La_3Si_6O_{11}$:Ce, orange color α-SiAlON:Eu, red color $CaAlSiN_3$:Eu,$Sr_2Si_5N_8$:Eu,$SrSiAl_4N_7$:Eu, $SrLiAl_3N_4$:Eu,$Ln_{4-x}(Eu_zM_{1-z})_xSi_{12-y}Al_yO_{3+x+y}$ $N_{18-x-y}$ (0.5≤x≤3, 0<z<0.3, 0<y≤4)     Formula (1)

In Formula (1) of Table 1, Ln may be at least one element selected from the group consisting of group Ma elements and rare-earth elements, and M may be at least one element selected from the group consisting of calcium (Ca), barium (Ba), strontium (Sr), and magnesium (Mg).

Fluoride-based: KSF-based red color $K_2SiF_6$:$Mn_4^+$, $K_2TiF_6$:$Mn_4^+$, $NaYF_4$:$Mn_4^+$, $NaGdF_4$:$Mn_4^+$, $K_3SiF_7$:$Mn_4^+$.

The composition of the phosphor needs to basically conform with stoichiometry, and the respective elements may be substituted by other elements included in the respective groups of the periodic table. For example, strontium (Sr) may be substituted by at least one selected from the group consisting of barium (Ba), calcium (Ca), and magnesium (Mg) of alkaline-earth group II, and Y may be substituted by at least one selected from the group consisting of terbium (Tb), lutetium (Lu), scandium (Sc), and gadolinium (Gd). In addition, europium (Eu), which is an activator, may be substituted by at least one selected from the group consisting of cerium (Ce), terbium (Tb), praseodymium (Pr), erbium (Er), and ytterbium (Yb) according to a desired energy level. The activator may be applied solely by itself or a sub activator may be additionally applied for characteristic modification.

In particular, in order to improve the reliability at a high temperature and high humidity, the fluoride-based red phosphor may be coated with an Mn-free fluoride material or may further include an organic coating on the surface of the phosphor or the coated surface of the Mn-free fluoride material. In the case of the fluoride-based red phosphor, it is possible to implement a narrow half-width of about 40 nm or less unlike other phosphors. Thus, the fluoride-based red phosphor may be applied to a high-resolution TV such as an Ultra-HD (UHD) TV.

Table 1 below shows types of phosphors according to applications of a white LED using a blue LED chip (about 440 nm to about 460 nm) or a UV LED chip (about 380 nm to about 440 nm).

TABLE 1

| Usage | Phosphor | Usage | Phosphor |
|---|---|---|---|
| LED TV BLU | β-SiAlON:$Eu^{2+}$<br>(Ca, Sr)AlSiN$_3$:$Eu^{2+}$<br>La$_3$Si$_6$N$_{11}$:$Ce^{3+}$<br>K$_2$SiF$_6$:$Mn^{4+}$<br>SrLiAl$_3$N$_4$:Eu<br>Ln$_{4-x}$(Eu$_z$M$_{1-z}$)$_x$Si$_{12-y}$Al$_y$O$_{3+x+y}$N$_{18-x-y}$<br>(0.5 ≤ x ≤ 3, 0 < z < 0.3, 0 < y ≤ 4)<br>K$_2$TiF$_6$:$Mn^{4+}$<br>NaYF$_4$:$Mn^{4+}$<br>NaGdF$_4$:$Mn^{4+}$ | Side View (Mobile, Note PC) | Lu$_3$Al$_5$O$_{12}$:$Ce^{3+}$<br>Ca-α-SiAlON:$Eu^{2+}$<br>La$_3$Si$_6$N$_{11}$:$Ce^{3+}$<br>(Ca, Sr)AlSiN$_3$:$Eu^{2+}$<br>Y$_3$Al$_5$O$_{12}$:$Ce^{3+}$<br>(Sr, Ba, Ca, Mg)$_2$SiO$_4$:$Eu^{2+}$<br>K$_2$SiF$_6$:$Mn^{4+}$<br>SrLiAl$_3$N$_4$:Eu<br>Ln$_{4-x}$(Eu$_z$M$_{1-z}$)$_x$Si$_{12-y}$Al$_y$O$_{3+x+y}$N$_{18-x-y}$<br>(0.5 ≤ x ≤ 3, 0 < z < 0.3, 0 < y ≤ 4)<br>K$_2$TiF$_6$:$Mn^{4+}$<br>NaYF$_4$:$Mn^{4+}$<br>NaGdF$_4$:$Mn^{4+}$ |
| Illumination | Lu$_3$Al$_5$O$_{12}$:$Ce^{3+}$<br>Ca-α-SiAlON:$Eu^{2+}$<br>La$_3$Si$_6$N$_{11}$:$Ce^{3+}$<br>(Ca, Sr)AlSiN$_3$:$Eu^{2+}$<br>Y$_3$Al$_5$O$_{12}$:$Ce^{3+}$<br>K$_2$SiF$_6$:$Mn^{4+}$<br>SrLiAl$_3$N$_4$:Eu<br>Ln$_{4-x}$(Eu$_z$M$_{1-z}$)$_x$Si$_{12-y}$Al$_y$O$_{3+x+y}$N$_{18-x-y}$<br>(0.5 ≤ x ≤ 3, 0 < z < 0.3, 0 < y ≤ 4)<br>K$_2$TiF$_6$:$Mn^{4+}$ | Electrical Component (Head Lamp, etc.) | Lu$_3$Al$_5$O$_{12}$:$Ce^{3+}$<br>Ca-α-SiAlON:$Eu^{2+}$<br>La$_3$Si$_6$N$_{11}$:$Ce^{3+}$<br>(Ca, Sr)AlSiN$_3$:$Eu^{2+}$<br>Y$_3$Al$_5$O$_{12}$:$Ce^{3+}$<br>K$_2$SiF$_6$:$Mn^{4+}$<br>SrLiAl$_3$N$_4$:Eu<br>Ln$_{4-x}$(Eu$_z$M$_{1-z}$)$_x$Si$_{12-y}$Al$_y$O$_{3+x+y}$N$_{18-x-y}$<br>(0.5 ≤ x ≤ 3, 0 < z < 0.3, 0 < y ≤ 4)<br>K$_2$TiF$_6$:$Mn^{4+}$ |

TABLE 1-continued

| Usage | Phosphor | Usage | Phosphor |
|---|---|---|---|
| | $NaYF_4:Mn^{4+}$ | | $NaYF_4:Mn^{4+}$ |
| | $NaGdF_4:Mn^{4+}$ | | $NaGdF_4:Mn^{4+}$ |

In addition, the wavelength conversion unit may include wavelength conversion materials such as a quantum dot (QD) by substituting phosphors or combining phosphors.

Figure 22:
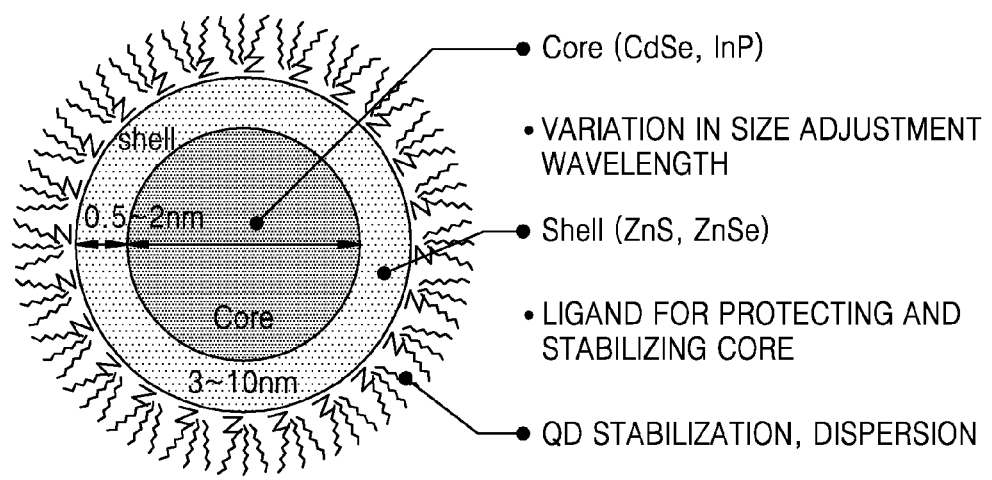
FIG. 22 schematically illustrates a cross-sectional structure of a quantum dot (QD), which may be used as a wavelength conversion material for an LED package, according to an exemplary embodiment.

FIG. 22 schematically illustrates a cross-sectional structure of a QD, which may be used as a wavelength conversion material for an LED package, according to an exemplary embodiment.

Referring to FIG. 22, the QD may have a core-shell structure using group III-V or II-VI compound semiconductors. For example, QD may have a core such as CdSe or InP and a shell such as ZnS or ZnSe. In addition, the QD may include a ligand for stabilizing the core and the shell. For example, the core may have a diameter of about 1 nm to about 30 nm and specifically about 3 nm to about 10 nm. The shell may have a thickness of about 0.1 nm to about 20 nm and specifically 0.5 nm to about 2 nm.

The QD may implement various colors according to a size of the QD. In particular, when the QD is used as a phosphor substitute, the QD may be used as a red or green phosphor. In the case of using the QD as a red or green phosphor, a narrow half-width (for example, about 35 nm) may be implemented.

The wavelength conversion material may be implemented as being contained in an encapsulating material. However, the wavelength conversion material may be previously prepared in a film shape and be attached to a surface of an optical structure such as an LED chip or a light guide plate. In this case, the wavelength conversion material may be easily applied to a desired region in a structure having a uniform thickness.

Figure 23:
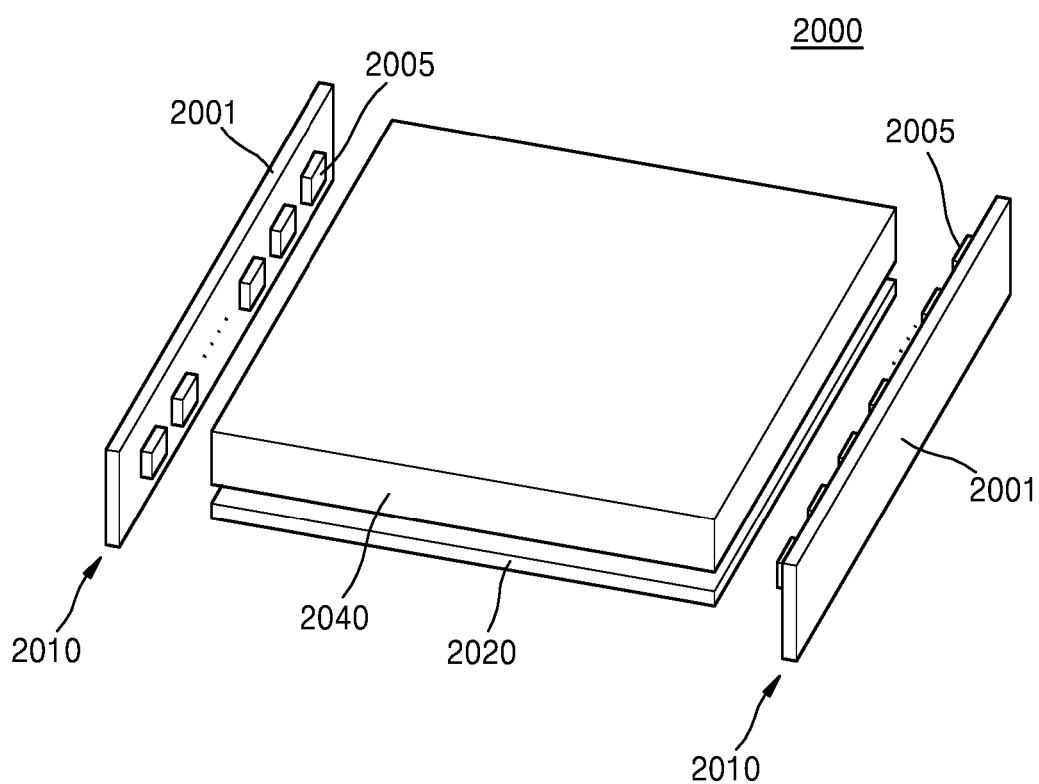
FIG. 23 is a schematic perspective view of a backlight unit including an LED package, according to an exemplary embodiment.

FIG. 23 is a schematic perspective view of a backlight unit 2000 including an LED package, according to an exemplary embodiment.

Referring to FIG. 23, the backlight unit 2000 may include a light guide plate 2040 and light source modules 2010 on two sides of the light guide plate 2040. In addition, the backlight unit 2000 may further include a reflective plate 2020 under the light guide plate 2040. The backlight unit 2000 according to the present exemplary embodiment may be an edge-type backlight unit. According to some exemplary embodiments, the light source module 2010 may be provided only one side of the light guide plate 2040 or may be additionally provided on the other side. The light source module 2010 may include a printed circuit board (PCB) 2001 and a plurality of light sources 2005 mounted on the PCB 2001. The light source 2005 may be at least one of the above-described LED packages 100 to 600 according to exemplary embodiments.

Figure 24:
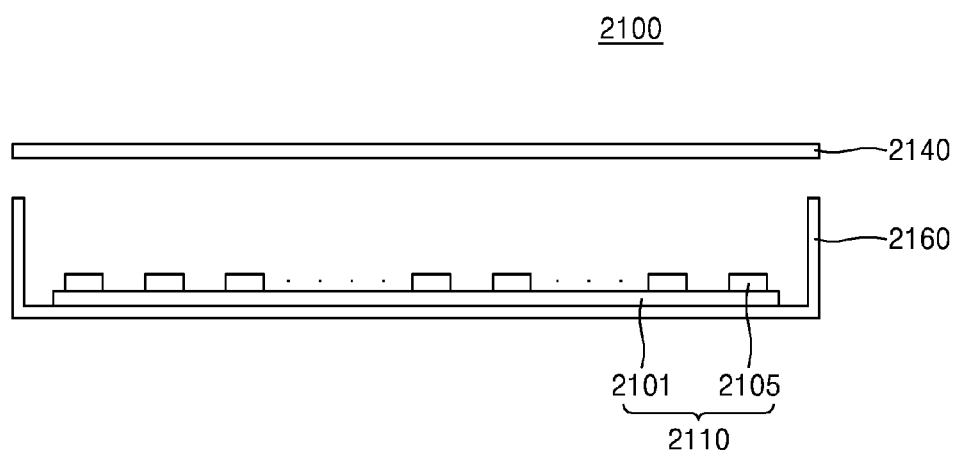
FIG. 24 is a cross-sectional view of a direct-type backlight unit including an LED package, according to another exemplary embodiment.

FIG. 24 is a cross-sectional view of a direct-type backlight unit 2100 including an LED package, according to another exemplary embodiment.

Referring to FIG. 24, the backlight unit 2100 may include a light diffusion plate 2140 and a light source module 2110 under the light diffusion plate 2140. In addition, the backlight unit 2100 may further include a bottom case 2160 under the light diffusion plate 2140 to accommodate the light source module 2110. The backlight unit 2100 according to the present exemplary embodiment may be a direct-type backlight unit.

The light source module 2110 may include a PCB 2101 and a plurality of light sources 2105 mounted on the PCB 2101. The light sources 2105 may be at least one of the above-described LED packages 100 to 600 according to exemplary embodiments.

Figure 25:
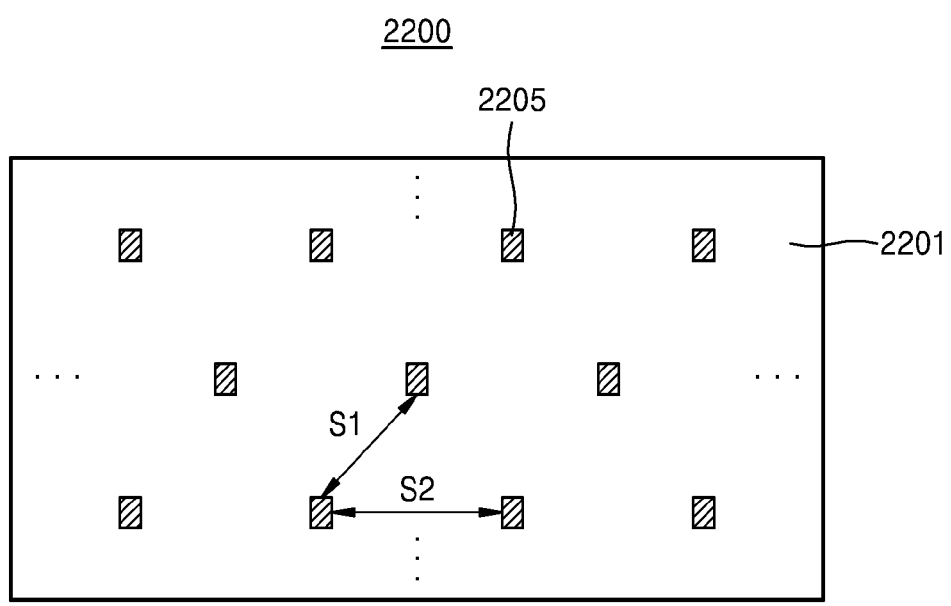
FIG. 25 is a plan view of a backlight unit including an LED package, according to another exemplary embodiment.

FIG. 25 is a plan view of a backlight unit 2200 including an LED package, according to another exemplary embodiment.

Specifically, FIG. 25 illustrates an example of an arrangement of a light source 2205 in the direct-type backlight unit 2200. The light source 2205 may be at least one of the above-described LED packages 100 to 600 according to exemplary embodiments.

The direct-type backlight unit 2200 according to the present exemplary embodiment may include a plurality of light sources 2205 arranged on a substrate 2201. The light sources 2205 may be arranged in a matrix form, of which rows and columns are in a zigzag arrangement. A second matrix having the same shape may be arranged in a first matrix in which the plurality of light sources 2205 are arranged in rows and columns on a straight line. It may be understood that the light sources 2205 included in the second matrix are inside a rectangle formed by four adjacent light sources 2205 included in the first matrix.

In the direct-type backlight unit, the arrangement structure and intervals of the first matrix and the second matrix may be different so as to further improve brightness uniformity and optical efficiency thereof. Besides the method of arranging the plurality of light sources, distances S1 and S2 between the adjacent light sources may be optimized so as to ensure the brightness uniformity. In this manner, the rows and columns on which the light sources 2205 are arranged may be in a zigzag arrangement, instead of a straight line arrangement, thus reducing the number of light sources 2205 by about 15% to about 25% with respect to the same light emission area. Also, other types of arrangements instead of or in addition to the straight line arrangement and the zigzag arrangement may also be used according to certain exemplary embodiments.

Figure 26:
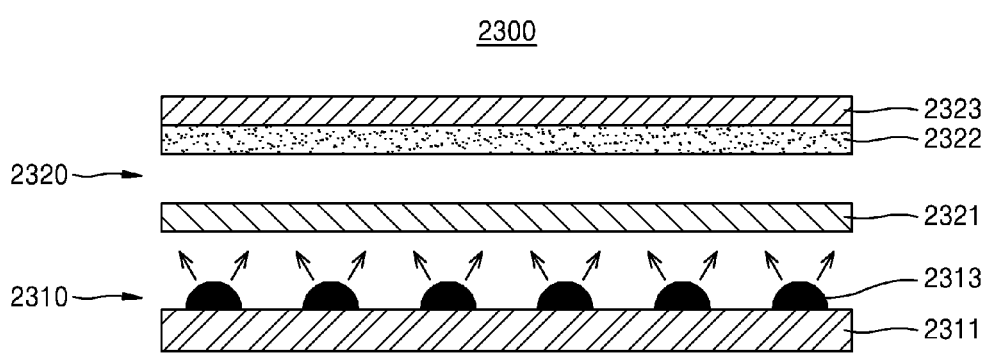
FIG. 26 is a cross-sectional view of a direct-type backlight unit including an LED package, according to another exemplary embodiment.
Figure 27:
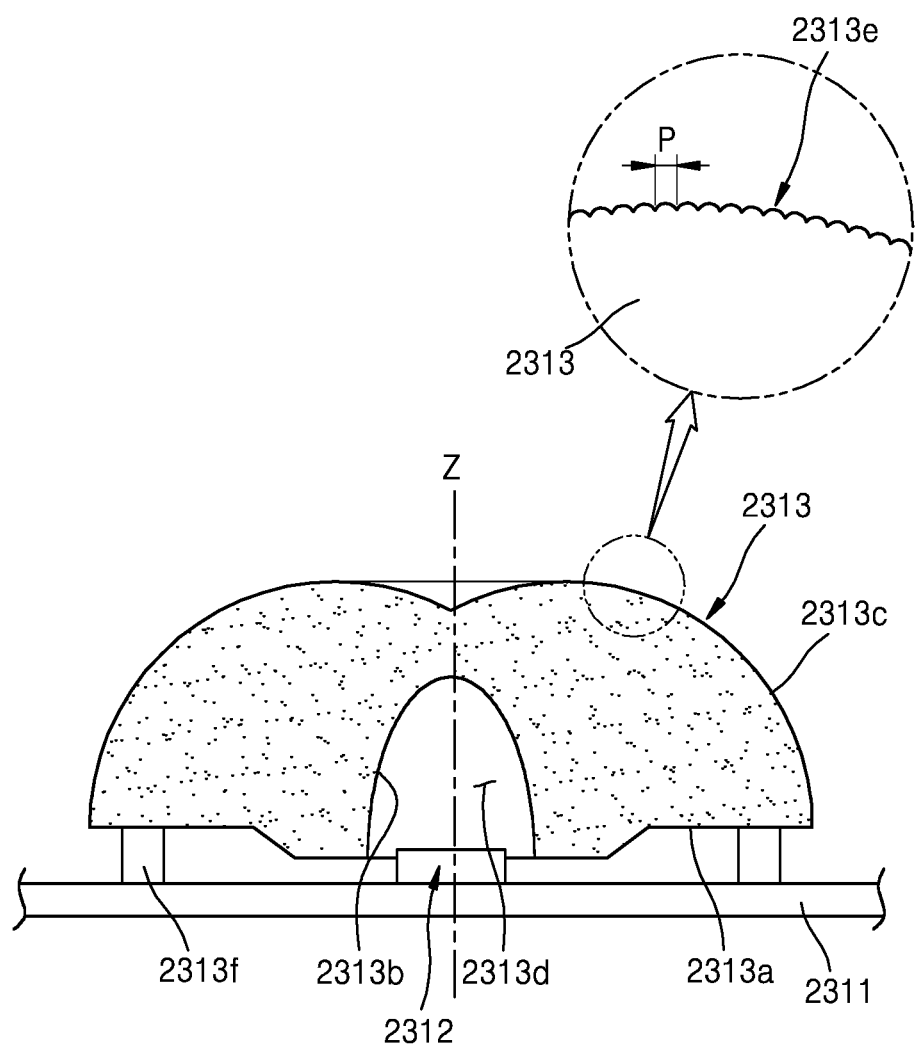
FIG. 27 is an enlarged view of a light source module illustrated in FIG. 26.

FIG. 26 is a cross-sectional view of a direct-type backlight unit 2300 including an LED package, according to another exemplary embodiment, and FIG. 27 is an enlarged view of a light source module 2310 illustrated in FIG. 26.

Referring to FIG. 26, the direct-type backlight unit 2300 according to the present exemplary embodiment may include an optical sheet 2320 and the light source module 2310 under the optical sheet 2320. The optical sheet 2320 may include a diffusion sheet 2321, a light concentration sheet 2322, and a protection sheet 2323.

The light source module 2310 may include a circuit board 2311, a plurality of light sources 2312 mounted on the circuit board 2311, and a plurality of optical elements 2313 respectively on the plurality of light sources 2312. The light source 2312 may be at least one of the above-described LED packages 100 to 600 according to exemplary embodiments.

The optical element 2313 may adjust an orientation angle of light through reflection. In particular, a light orientation-angle lens configured to diffuse light of the light source 2312 to a wide region may be used. Since the light source 2312, to which the optical element 2313 is attached, has a wider light distribution, the number of light sources 2312 per the same area may be reduced when the light source module 2310 is used in a backlight or a flat-panel lighting apparatus.

As illustrated in FIG. 27, the optical element 2313 may include a bottom surface 2313*a* on the light source 2312, an incidence surface 2313*b* on which the light of the light source 2312 is incident, and an exit surface 2313*c* from which the light is output. The bottom surface 2313*a* of the optical element 2313 may have a groove 2313*d* recessed in a direction of the exit surface 2313*c* in a center through which an optical axis Z of the light source 2312 passes. The groove 2313*d* may be defined as an incidence surface 2313*b* on which the light of the light source 2312 is incident. That is, the incidence surface 2313*b* may form a surface of the groove 2313*d*.

The bottom surface 2313*a* of the optical element 2313 may partially protrude toward the light source 2312 in a central portion connected to the incidence surface 2313*b* to thereby have a non-planar structure as a whole. That is, unlike a general flat structure, the entire bottom surface 2313*a* of the optical element 2313 may partially protrude along a periphery of the groove 2313*d*. A plurality of supports 2313*f* may be provided on the bottom surface 2313*a* of the optical element 2313. When the optical element 2313 is mounted on the circuit board 2311, the plurality of supports 2313*f* may fix and support the optical element 2313.

The exit surface 2313*c* of the optical element 2313 may protrude upward (a light exit direction) from an edge connected to the bottom surface 2313*a* in a dome shape, and have an inflection point such that a center through which the optical axis Z passes is concavely recessed toward the groove 2313*d*. A plurality of concave/convex portions 2313*e* may be periodically arranged on the exit surface 2313*c* in a direction of the edge from the optical axis Z. The plurality of concave/convex portions 2313*e* may have a ring shape corresponding to a horizontal cross-sectional shape of the optical element 2313 and may form a concentric circle from the optical axis Z. The plurality of concave/convex portions 2313*e* may be radially arranged while forming periodic patterns along the surface of the exit surface 2313*c* from the center of the optical axis Z.

The plurality of concave/convex portions 2313*e* may be spaced apart by regular pitches P to form patterns. In this case, the pitch P between the plurality of concave/convex portions 2313*e* may be in the range of about 0.01 mm to about 0.04 mm. The plurality of concave/convex portions 2313*e* may offset a difference of performance between the optical elements due to a fine processing error that may occur in the process of manufacturing the optical element 2313, and may improve the uniformity of the light distribution accordingly.

Figure 28:
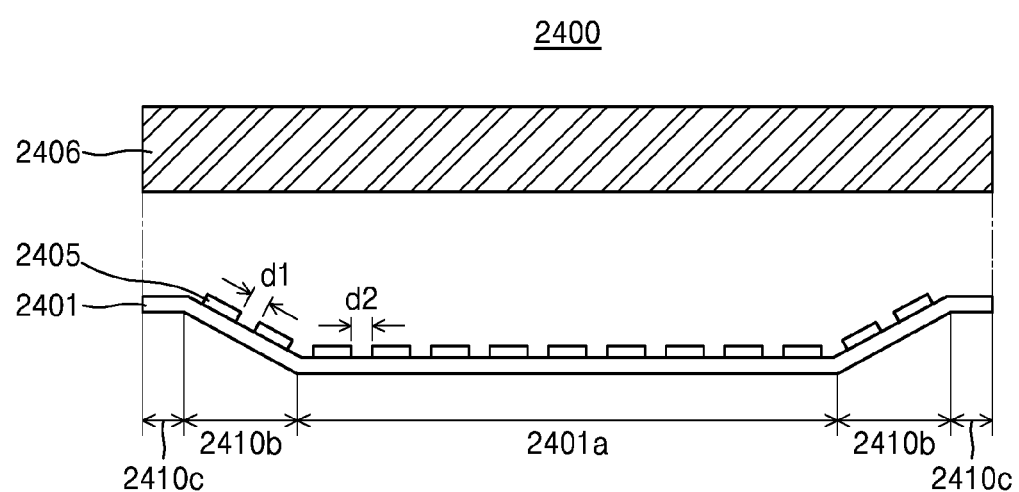
FIG. 28 is a cross-sectional view of a direct-type backlight unit including an LED package, according to another exemplary embodiment.

FIG. 28 is a cross-sectional view of a direct-type backlight unit 2400 including an LED package, according to another exemplary embodiment.

Referring to FIG. 28, the direct-type backlight unit 2400 may include a circuit board 2401, a light source 2405 mounted on the circuit board 2401, and one or more optical sheets 2406 on the light source 2405. The light source 2405 may be a white LED including a red phosphor. The light source 2405 may be a module mounted on the circuit board 2401. The light source 2405 may be at least one of the above-described LED packages 100 to 600 according to exemplary embodiments.

The circuit board 2401 may have a first flat portion 2401*a* corresponding to a main region, an inclined portion 2410*b* arranged around the first flat portion 2401*a* and bent in at least a portion thereof, and a second flat portion 2410*c* arranged at an edge of the circuit board 2401 that is an outside of the inclined portion 2410*b*. The light sources 2405 may be arranged at a first interval d1 on the first flat portion 2401*a*, and one or more light sources 2405 may also be arranged at a second interval d2 on the inclined portion 2410*b*. The first interval d1 may be substantially equal to the second interval d2. A width (or a length in a cross-section) of the inclined portion 2410*b* may be smaller than a width of the first flat portion 2401*a* and larger than a width of the second flat portion 2410*c*. In addition, at least one light source 2405 may be arranged on the second flat portion 2410*c* when necessary.

A slope of the inclined portion 2410*b* may be appropriately adjusted in the range of greater than 0 degree and less than 90 degrees with reference to the first flat portion 2401*a*. Due to such a configuration, the circuit board 2401 may maintain uniform brightness even at the edge of the optical sheet 2406.

Figure 29:
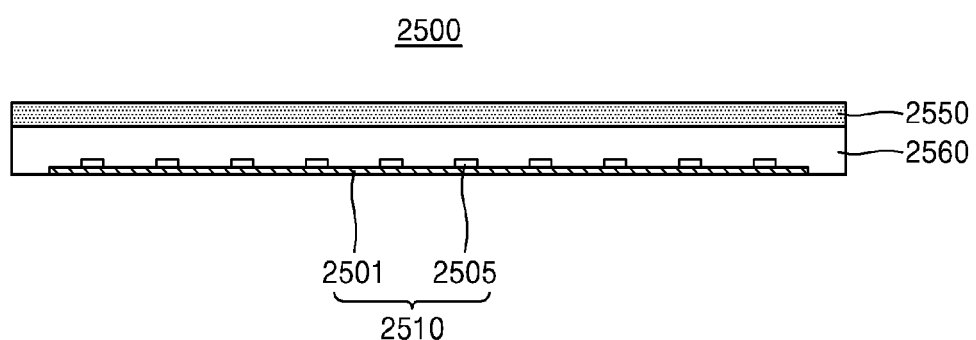
FIGS. 29, 30 and 31 are cross-sectional views of backlight units including an LED package, according to exemplary embodiments.
Figure 30:
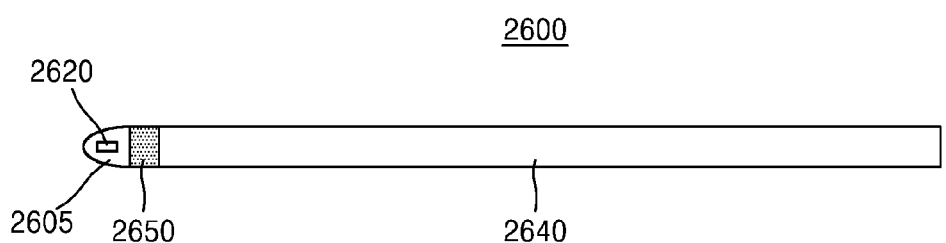
Figure 31:
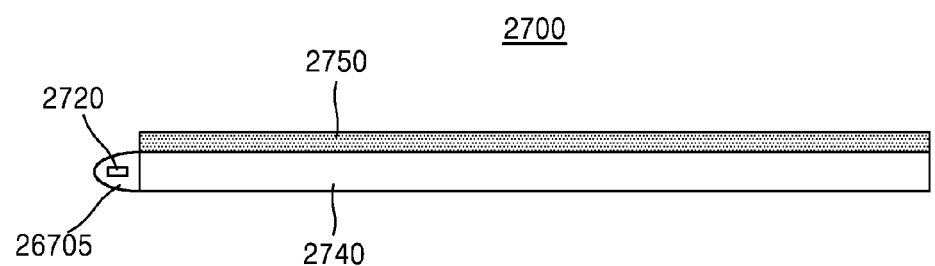

FIGS. 29, 30 and 31 are cross-sectional views of backlight units 2500, 2600, and 2700 including an LED package, according to exemplary embodiments.

In the backlight units 2500, 2600, and 2700, wavelength conversion units 2550, 2650, and 2750 are not arranged in light sources 2505, 2605, and 2705. Instead, the wavelength conversion units 2550, 2650, and 2750 are arranged in the backlight units 2500, 2600, and 2700 outside the light sources 2505, 2605, and 2705 so as to convert light. The light sources 2505, 2605, and 2705 may be implemented as at least one of the above-described LED packages 100 to 600 according to exemplary embodiments.

The backlight unit 2500 of FIG. 29 is a direct-type backlight unit and may include the wavelength conversion unit 2550, a light source module 2510 under the wavelength conversion unit 2550, and a bottom case 2560 accommodating the light source module 2510. In addition, the light source module 2510 may include a PCB 2501 and a plurality of light sources 2505 mounted on the PCB 2501.

In the backlight unit 2500, the wavelength conversion unit 2550 may be on the bottom case 2560. Therefore, at least a part of the light emitted by the light source module 2510 may be wavelength-converted by the wavelength conversion unit 2550. The wavelength conversion unit 2550 may be manufactured as a separate film and may be integrated with a light diffusion plate.

The backlight units 2600 and 2700 of FIGS. 30 and 31 are edge-type backlight units and may include the wavelength conversion unit 2650 and 2750, light guide plates 2640 and 2740, reflection units 2620 and 2720 and light sources 2605 and 2705 arranged on one side of the light guide plates 2640 and 2740. The light emitted by the light sources 2605 and 2705 may be guided inside the light guide plates 2640 and 2740 by the reflection units 2620 and 2720. In the backlight unit 2600 of FIG. 30, the wavelength conversion unit 2650 may be arranged between the light guide plate 2640 and the light source 2605. In the backlight unit 2700 of FIG. 31, the wavelength conversion unit 2750 may be on a light emission surface of the light guide plate 2740.

The wavelength conversion units 2550, 2650, and 2750 may include typical phosphors. In particular, QD phosphors may be used for supplementing characteristics of QDs vulnerable to moisture or heat from the light source.

Figure 32:
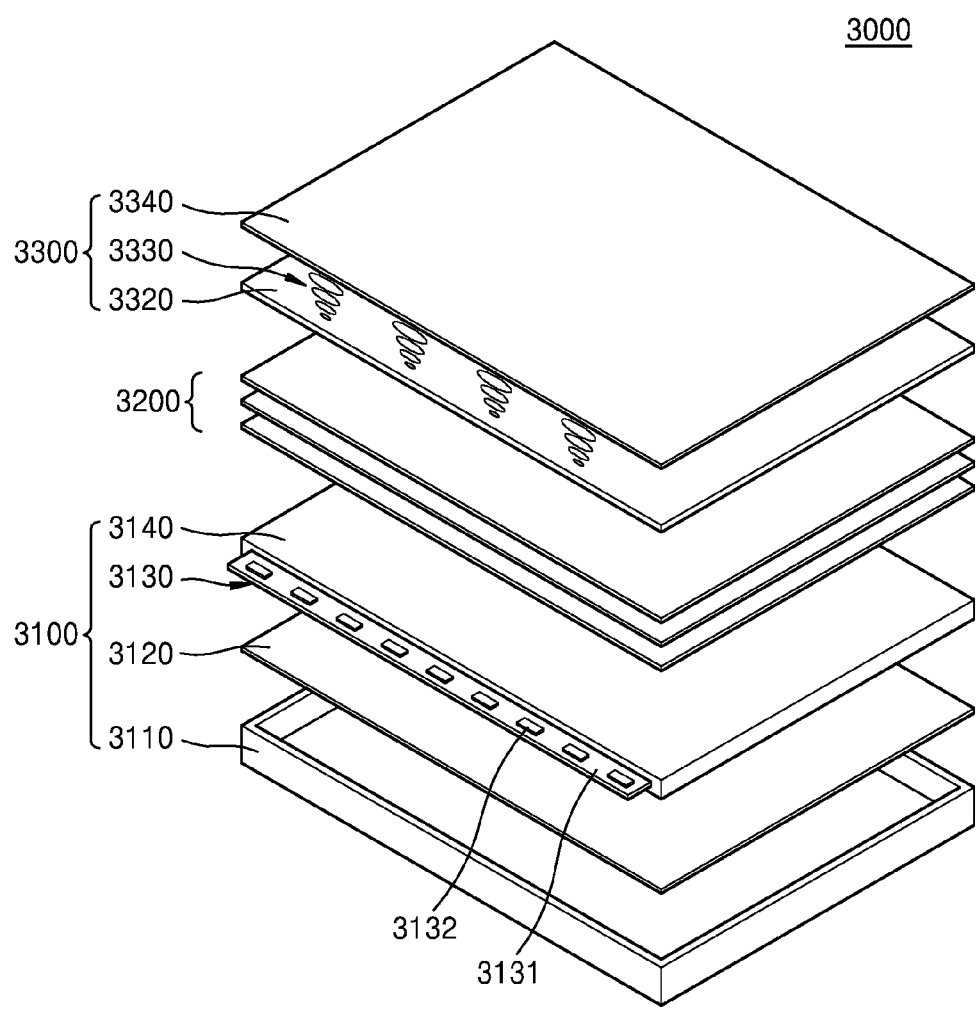
FIG. 32 is an exploded perspective view of a display apparatus including an LED package, according to an exemplary embodiment.

FIG. 32 is an exploded perspective view of a display apparatus 3000 including an LED package, according to an exemplary embodiment.

Referring to FIG. 32, the display apparatus 3000 may include a backlight unit 3100, an optical sheet 3200, and a display panel 3300 such as a liquid crystal panel. The backlight unit 3100 may include a bottom case 3110, a reflection plate 3120, a light guide plate 3140, and a light source module 3130 on at least one side of the light guide plate 3140. The light source module 3130 may include a PCB 3131 and a light source 3132.

In particular, the light source 3132 may be a side view type LED mounted on a side adjacent to a light emission surface. The light source 3132 may be at least one of the above-described LED packages 100 to 600 according to exemplary embodiments. The optical sheet 3200 may be disposed between the light guide plate 3140 and the display panel 3300 and may include various types of sheets, such as a diffusion sheet, a prism sheet, or a protection sheet.

The display panel 3300 may display an image by using light emitted from the optical sheet 3200. The display panel 3300 may include an array substrate 3320, a liquid crystal layer 3330, and a color filter substrate 3340. The array substrate 3320 may include pixel electrodes arranged in a matrix form, thin film transistors configured to apply a driving voltage to the pixel electrodes, and signal lines configured to operate the thin film transistors.

The color filter substrate 3340 may include a transparent substrate, a color filter, and a common electrode. The color filter may include filters configured to selectively transmit light having a specific wavelength in white light emitted by the backlight unit 3100. The liquid crystal layer 3330 may be rearranged by an electric field formed between the pixel electrode and the common electrode and adjust an optical transmittance. The light, of which the optical transmittance is adjusted, may display an image while passing through the color filter of the color filter substrate 3340. The display panel 3300 may further include a driving circuit configured to process an image signal.

According to the present exemplary embodiment, since the display apparatus 3000 uses the light source 3132 configured to emit blue light, green light, and red light having a relatively small half-width, the emitted light may implement blue, green, and red colors having high color purity after passing through the color filter substrate 3340.

Figure 33:
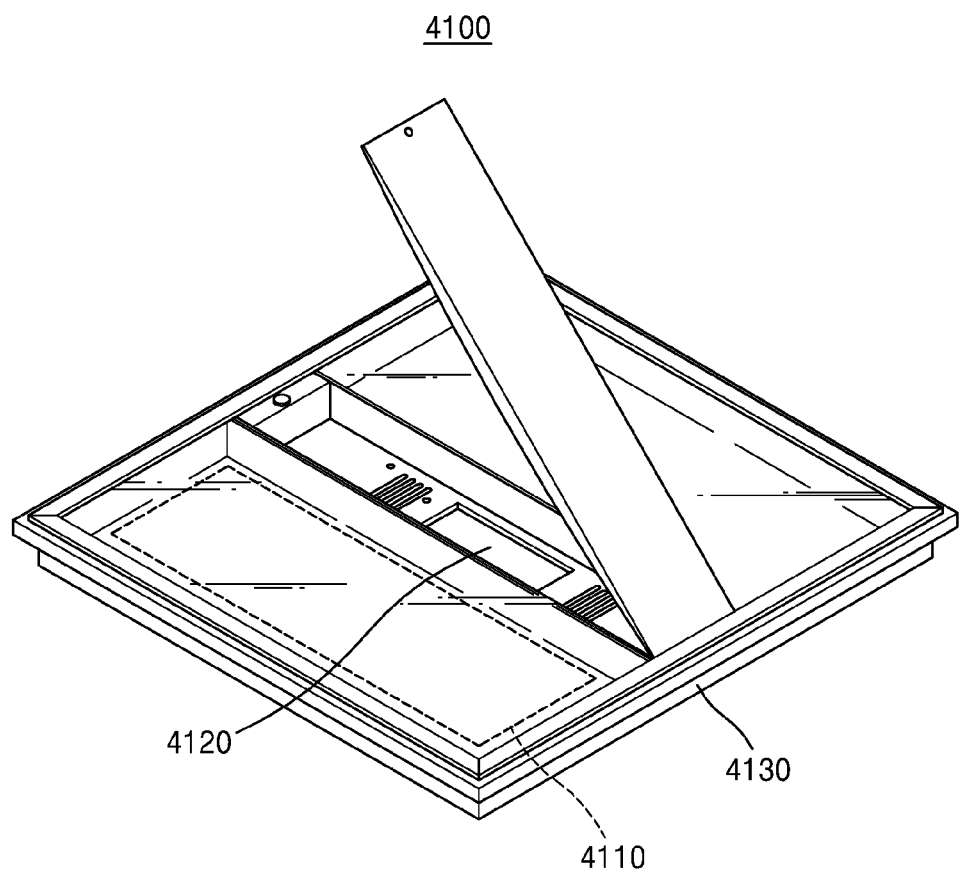
FIG. 33 is a perspective view of a flat-panel lighting apparatus including an LED package, according to an exemplary embodiment.

FIG. 33 is a perspective view of a flat-panel lighting apparatus 4100 including an LED package, according to an exemplary embodiment.

Referring to FIG. 33, the flat-panel lighting apparatus 4100 may include a light source module 4110, a power supply 4120, and a housing 4030. According to the present exemplary embodiment, the light source module 4110 may include an LED array as a light source. The light source module 4110 may be at least one of the above-described LED packages 100 to 600 according to exemplary embodiments. The power supply 4120 may include an LED driver.

The light source module 4110 may include an LED array and may be formed to have a flat shape as a whole. According to the present exemplary embodiment, the LED array may include an LED and a controller configured to store driving information of the LED.

The power supply 4120 may be configured to supply power to the light source module 4110. The housing 4130 may form an accommodation space for accommodating the light source module 4110 and the power supply 4120. The housing 4130 is formed to have a hexahedral shape with one opened side, but is not limited thereto. The light source module 4110 may be arranged to emit light toward the opened side of the housing 4130.

Figure 34:
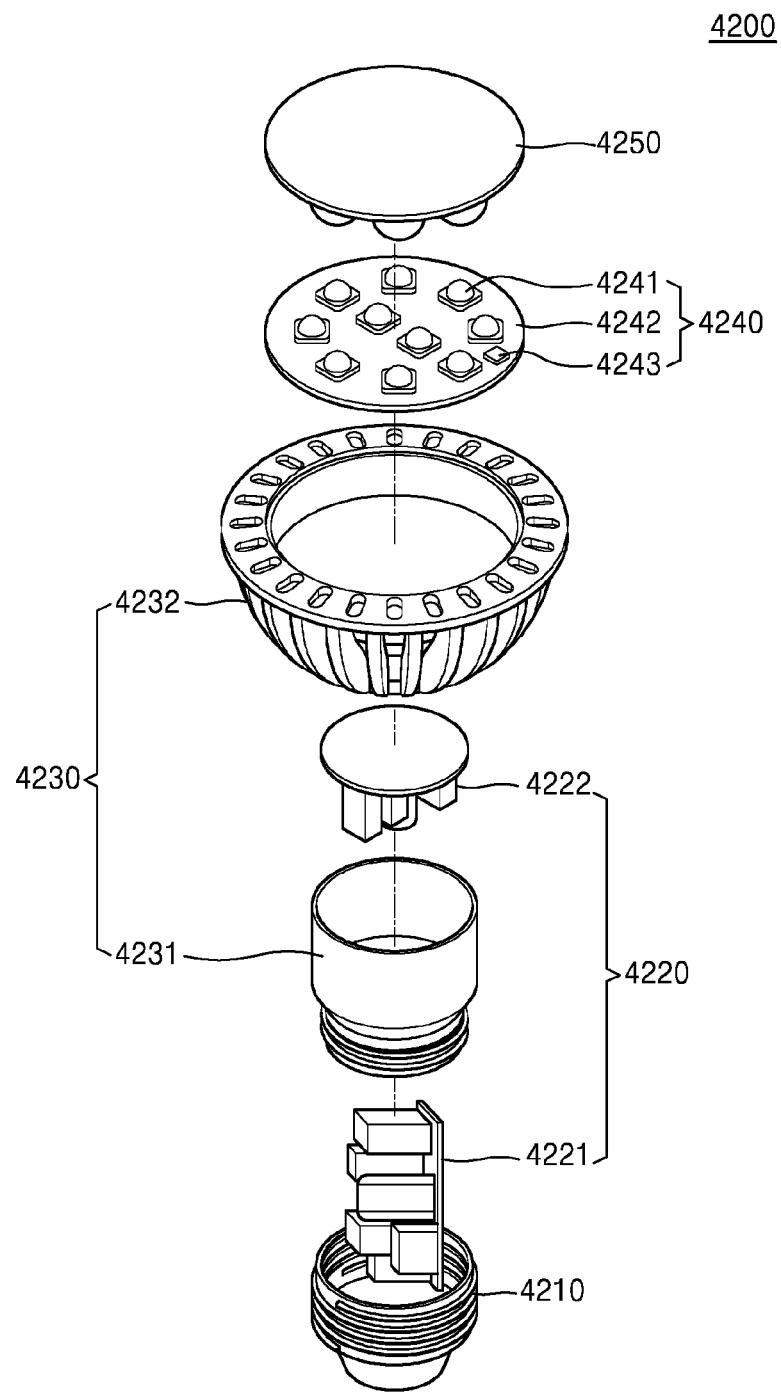
FIG. 34 is an exploded perspective view of a lighting apparatus including an LED package, according to an exemplary embodiment.

FIG. 34 is an exploded perspective view of a lighting apparatus 4200 including an LED package, according to an exemplary embodiment.

Referring to FIG. 34, the lighting apparatus 4200 may include a socket 4210, a power supply 4220, a heat sink 4230, a light source module 4240, and an optical unit 4250. According to the present exemplary embodiment, the light source module 4240 may include an LED array, and the power supply 4220 may include an LED driver.

The socket 4210 may be configured to be replaceable with an existing lighting apparatus. Power may be supplied to the lighting apparatus 4200 through the socket 4210. The power supply 4220 may be dissembled into a first power supply 4221 and a second power supply 4220. The heat sink 4230 may include an internal heat sink 4231 and an external heat sink 4232. The internal heat sink 4231 may be directly connected to the light source module 4240 and/or the power supply 4220. The internal heat sink 4231 may transfer heat to the external heat sink 4232. The optical unit 4250 may include an internal optical unit and an external optical unit. The optical unit 4250 may be configured to uniformly disperse light emitted by the light source module 4240.

The light source module 4240 may receive power from the power supply 4220 and emit light to the optical unit 4250. The light source module 4240 may include one or more LED packages 4241, a circuit board 4242, and controller 4243. The controller 4243 may store driving information of the LED packages 4241. The LED packages 4241 may be at least one of the above-described LED packages 100 to 600 according to exemplary embodiments.

Figure 35:
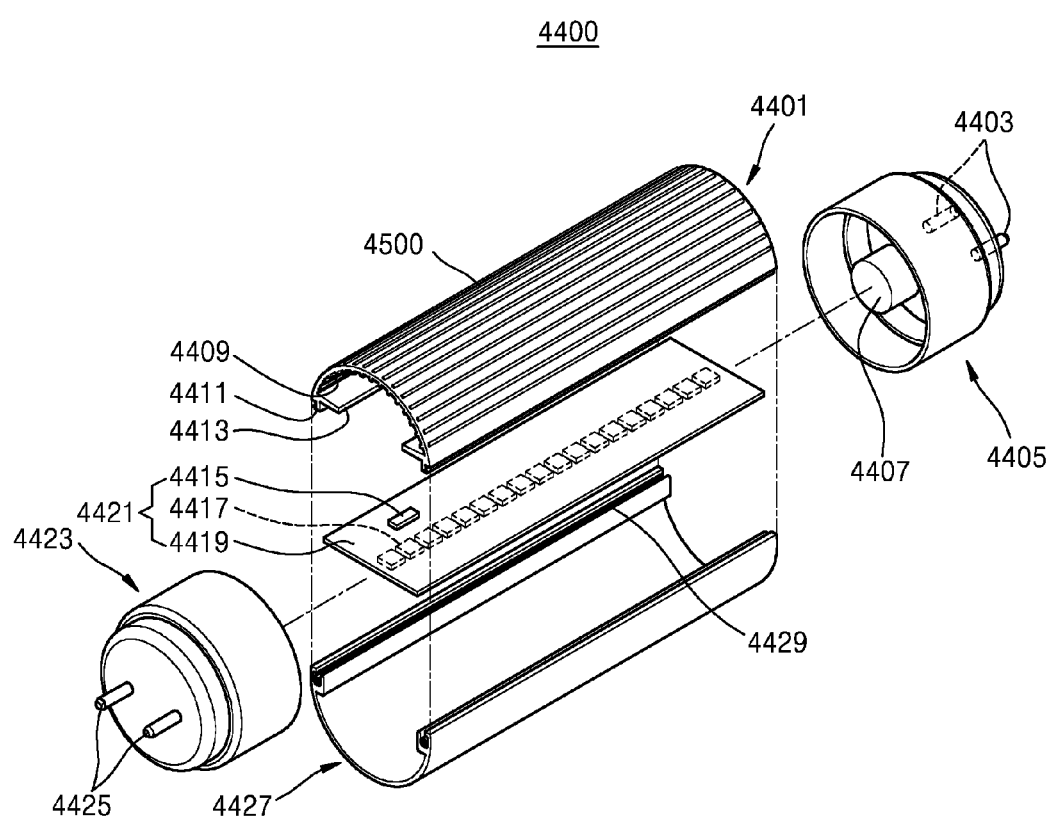
FIG. 35 is an exploded perspective view of a bar-type lighting apparatus including an LED package, according to an exemplary embodiment.

FIG. 35 is an exploded perspective view of a bar-type lighting apparatus 4400 including an LED package, according to an exemplary embodiment.

Referring to FIG. 35, the bar-type lighting apparatus 4400 may include a heat sink member 4401, a cover 4427, a light source module 4421, a first socket 4405, and a second socket 4423. A plurality of heat sink fins 4500 and 4409 having a concave/convex shape may be formed on inner or outer surfaces of the heat sink member 4401. The heat sink fins 4500 and 4409 may be designed to have various shapes and may be spaced apart from each other at various intervals. A support 4413 having a protruding shape may be formed inside the heat sink member 4401. The light source module 4421 may be fixed to the support 4413. Locking protrusions 4411 may be formed on both ends of the heat sink member 4401.

Locking grooves 4429 may be formed in the cover 4427. The locking protrusions 4411 of the heat sink member 4401 may be hooked to the locking grooves 4429. The positions of the locking grooves 4429 may be exchanged with the positions of the locking protrusions 4411.

The light source module 4421 may include an LED array. The light source module 4421 may include a PCB 4419, a light source 4417, and a controller 4415. The controller 4415 may store driving information of the light source 4417. Circuit wirings may be formed on the PCB 4419 so as to operate the light source 4417. In addition, the light source module 4421 may include components for operating the light source 4417. The light source 4417 may be at least one of the above-described LED packages 100 to 600 according to exemplary embodiments.

The first and second sockets 4405 and 4423 may be provided as a pair of sockets and may be connected to both ends of a cylindrical cover unit including the heat sink member 4401 and the cover 4427. For example, the first socket 4405 may include an electrode terminal 4403 and a power supply 4407, and the second socket 4423 may include a dummy terminal 4425. In addition, an optical sensor module and/or a communication module may be embedded into the first socket 4405 or the second socket 4423. For example, the optical sensor module and/or the communication module may be embedded into the second socket 4423 in which the dummy terminal 4425 is arranged. As another example, the optical sensor module and/or the communication module may be embedded into the first socket 4405 in which the electrode terminal 4403 is arranged.

Figure 36:
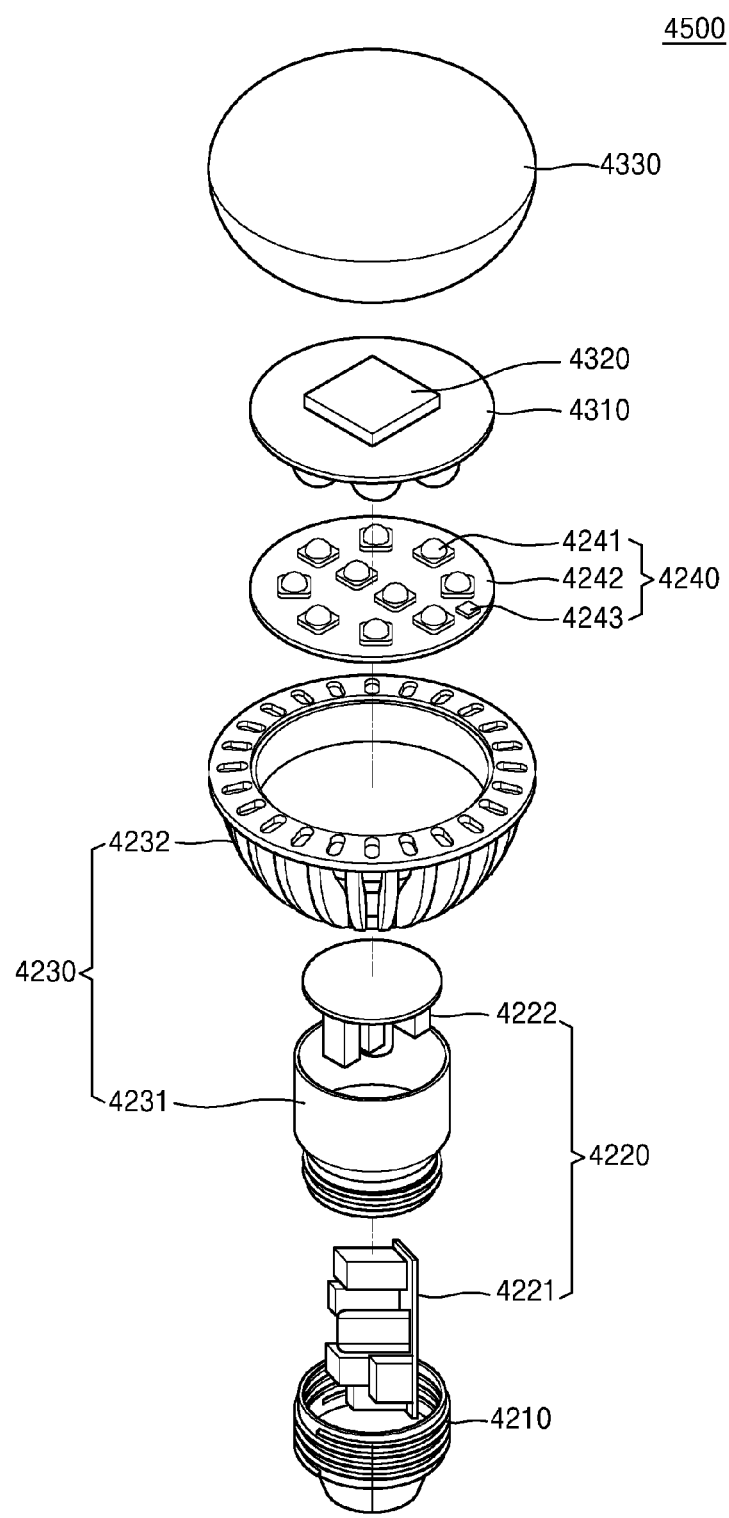
FIG. 36 is an exploded perspective view of a lighting apparatus including an LED package, according to an exemplary embodiment.

FIG. 36 is an exploded perspective view of a lighting apparatus 4500 including an LED package, according to an exemplary embodiment.

The lighting apparatus 4500 of FIG. 36 differs from the lighting apparatus 4200 of FIG. 34 in that a reflection plate 4310 and a communication module 4320 are provided on the light source module 4240. The reflection plate 4310 may uniformly disperse light from the light source in a lateral direction and a rearward direction so as to reduce glare.

The communication module 4320 may be mounted on the reflection plate 4310, and home network communication may be performed through the communication module 4320. For example, the communication module 4320 may be a wireless communication module using ZigBee, WiFi, or LiFi, and control an indoor or outdoor lighting apparatus in various ways, such as performing on/off operations or brightness adjustment of the lighting apparatus through a smartphone or a wireless controller. In addition, electronic appliances and vehicle systems, such as TVs, refrigerators, air conditioners, door lock systems, and vehicles may be controlled through a LiFi communication module using a wavelength of visible light in the indoor or outdoor lighting apparatus. The reflection plate 4310 and the communication module 4320 may be covered by the cover 4330.

Figure 37:
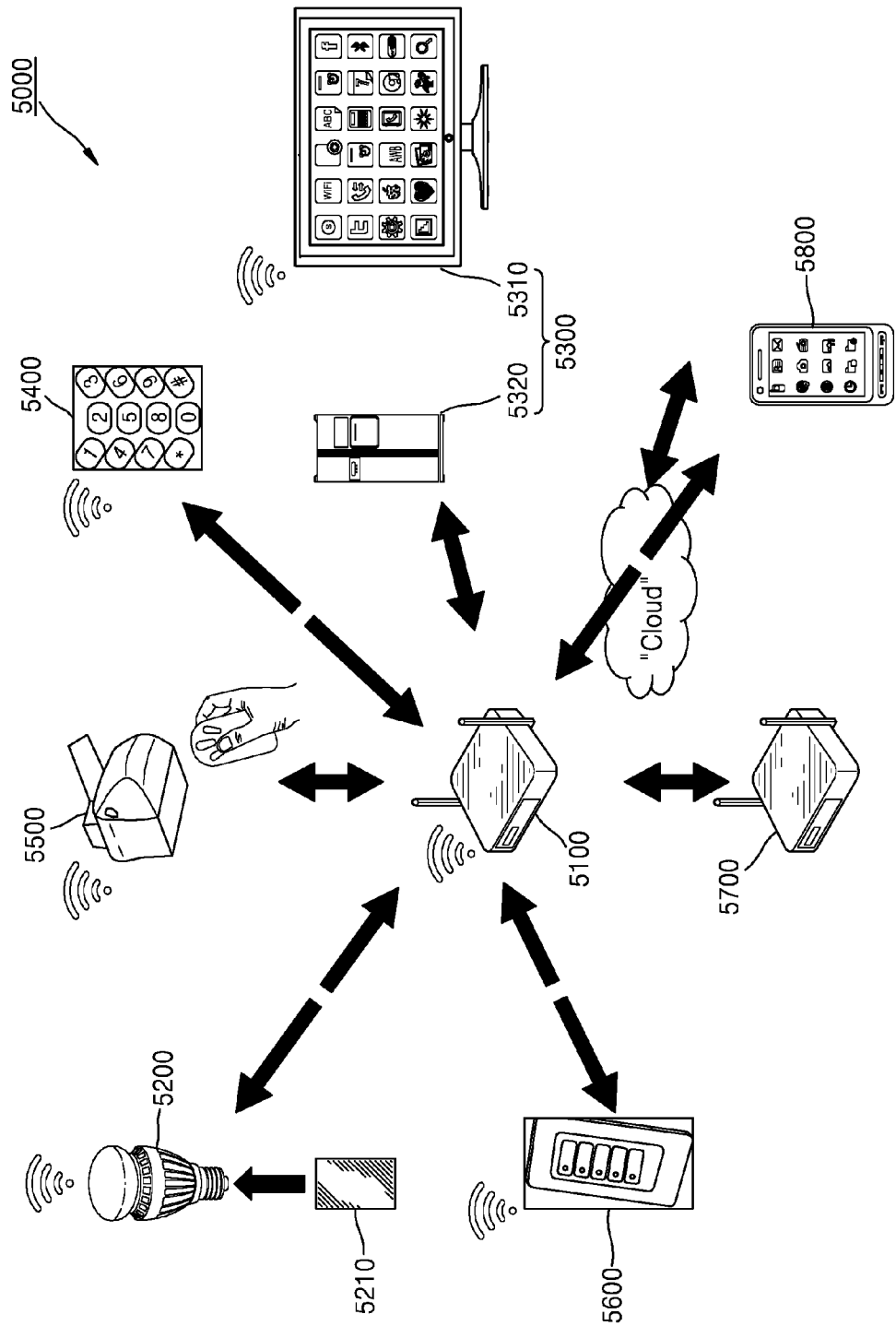
FIG. 37 is a diagram for describing an indoor lighting control network system including an LED package, according to an exemplary embodiment.

FIG. 37 is a diagram for describing an indoor lighting control network system 5000 including an LED package, according to an exemplary embodiment.

Referring to FIG. 37, the indoor lighting control network system 5000 may be a composite smart lighting-network system in which an illumination technology using an LED, Internet of Things (IoT) technology, and wireless communication technology converge. The network system 5000 may be implemented using various lighting apparatuses and wired or wireless communication devices, and may be implemented by a sensor, a controller, a communication device, and software for network control and maintenance.

The network system 5000 may be applied to a closed space inside of buildings or structures, such as offices, an open space such as parks or streets, and the like. The network system 5000 may be implemented based on an IoT environment so as to collect, process, and provide a variety of information to users.

An LED lamp 5200 included in the network system 5000 may receive information about an ambient environment from a gateway 5100 and control illumination of the LED lamp 5200 itself. Furthermore, the LED lamp 5200 may check and control the operation states of other devices 5300 to 5800 included in the IoT environment based on a visible light communication function of the LED lamp 5200. The LED lamp 5200 may be implemented as at least one of the above-described LED packages 100 to 600 according to exemplary embodiments.

The network system 5000 may include the gateway 5100 configured to process data transmitted and received in accordance with different communication protocols, the LED lamp 5200 communicably connected to the gateway 5100 and including an LED, and a plurality of devices 5300, 5400, 5500, 5600, 5700, and 5800 communicably connected to the gateway 5100 in accordance with various wireless communication schemes. In order to implement the network system 5000 based on the IoT environment, the devices 5300 to 5800, including the LED lamp 5200, may include at least one communication module. According to the present exemplary embodiment, the LED lamp 5200 may be communicably connected to the gateway 5100 by the wireless communication protocol such as WiFi, ZigBee, or LiFi. To this end, the LED lamp 5200 may include at least one lamp communication module 5210.

The network system 5000 may be applied to a closed space such as homes or offices, an open space such as parks or streets, and the like. In a case where the network system 5000 is applied to the home, the plurality of devices 5300 to 5800, which are included in the network system 5000 and communicably connected to the gateway 5100 based on the IoT technology, may include electronic appliances 5300, a digital door lock 5400, a garage door lock (e.g., garage door opener) 5500, a lighting switch 5600 installed on a wall, a router 5700 for relaying a wireless communication network, and mobile devices 5800 such as smartphones, tablets, or laptop computers.

In the network system 5000, the LED lamp 5200 may check the operation states of the various devices 5300 to 5800 or automatically control the illumination of the LED lamp 5200 itself according to the ambient environment and conditions by using the wireless communication network (e.g., ZigBee, WiFi, LiFi, etc.) installed at home. In addition, the LED lamp 5200 may control the devices 5300 to 5800 included in the network system 5000 through the LiFi communication using the visible light emitted by the LED lamp 5200.

The LED lamp 5200 may automatically control the illumination of the LED lamp 5200 based on the information about the ambient environment, which is transmitted from the gateway 5100 through the lamp communication module 5210, or the information about the ambient environment, which is collected from the sensor mounted on the LED lamp 5200. For example, the brightness of the LED lamp 5200 may be automatically adjusted according to a kind of a TV program aired on the TV 5310 or a screen brightness of the TV 5310. To this end, the LED lamp 5200 may receive operation information of the TV 5310 from the lamp communication module 5210 connected to the gateway 5100. The lamp communication module 5210 may be integrally modularized with the sensor and/or the controller included in the LED lamp 5200.

For example, when a program value of a TV program is a human drama, the LED lamp 5200 may lower a color temperature to 12,000K or less (e.g., 5,000K) and adjust a color sense according to a preset value, thus creating a cozy atmosphere. On the other hand, when a program value is a comedy program, the LED lamp 5200 may increase a color temperature to 5,000K or more according to a set value so as to be adjusted to bluish white light.

In addition, in certain situations such as when nobody is home, after a predetermined time elapses after the digital door lock 5400 has been locked, it is possible to prevent a waste of electricity by turning off the turned-on LED lamp 5200. Alternatively, in a case where a security mode is set through the mobile device 5800 or the like, when the digital door lock 5400 is locked and nobody is home, the LED lamp 5200 may maintain the turned-on state.

The operation of the LED lamp 5200 may be controlled according to information about the ambient environment, which is collected through various sensors connected to the network system 5000. For example, in a case where the network system 5000 is implemented in a building, it is possible to turn on or off the illumination by combining a lighting apparatus, a position sensor, and a communication module within the building, or provide collected information in real time, thus enabling efficient facility management or efficient utilization of unused space. Since a lighting apparatus such as the LED lamp 5200 may be arranged in various locations on each floor in a building, a variety of information about the building may be collected through a sensor integrally provided with the LED lamp 5200, and the collected information may be used for facility management and utilization of unused spaces.

As another example, by combining the LED lamp 5200 with an image sensor, a storage device, the lamp communication module 5210, or the like, the LED lamp 5200 may be used as a device capable of maintaining building security or sensing and counteracting emergency situations. For example, when a smoke or temperature sensor is attached to the LED lamp 5200, it is possible to promptly detect an outbreak of fire, thus minimizing fire damage. In addition, it is possible to adjust the brightness of the lighting apparatus, save energy, and provide a pleasant illumination environment, taking into consideration outside weather or an amount of sunshine.

As described above, the network system 5000 may be applied to a closed space such as homes, offices, or buildings, an open space such as parks or streets, and the like. In a case where the network system 5000 is intended to be applied to a large open space (e.g., a park), it may be relatively difficult to implement the network system 5000 due to a distance limitation of wireless communication and a communication interference caused by various obstacles. By mounting the sensors and the communication modules on various lighting apparatuses and using the lighting apparatuses as information collection units and communication relay units, the network system 5000 may be more efficiently implemented in the open environments.

Figure 38:
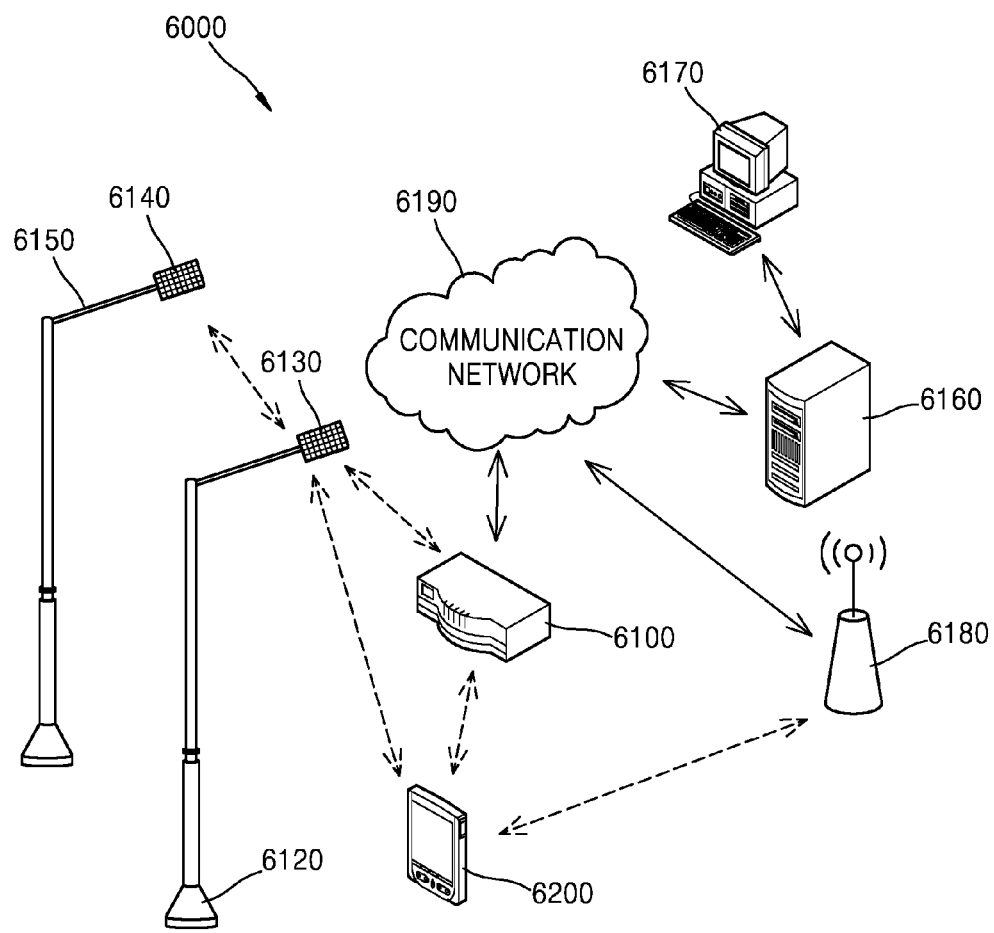
FIG. 38 is a diagram for describing a network system including an LED package, according to an exemplary embodiment.

FIG. 38 is a diagram for describing a network system 6000 including an LED package, according to an exemplary embodiment.

Specifically, FIG. 38 illustrates the network system 6000 applied to an open space. The network system 6000 may include a communication connecting device 6100, a plurality of lighting apparatuses 6120 and 6150 installed at predetermined intervals from each other and communicably connected to the communication connecting device 6100, a server 6160, a computer 6170 configured to manage the server 6160, a communication base station 6180, a communication network 6190 configured to connect communicable devices, and a mobile device 6200.

The plurality of lighting apparatuses 6120 and 6150 installed in open external spaces such as streets or parks may include smart engines 6130 and 6140, respectively. Each of the smart engines 6130 and 6140 may include an LED configured to emit light, a driver configured to drive the LED, a sensor configured to collect information about an ambient environment, and a communication module. The LEDs included in the smart engine 6130 and 6140 may be at least one of the above-described LED packages 100 to 600 according to exemplary embodiments.

The communication module may enable the smart engines 6130 and 6140 to communicate with other peripheral devices in accordance with the communication protocol such as WiFi, ZigBee, or LiFi.

For example, one smart engine 6130 may be communicably connected to the other smart engine 6140. In this case, a WiFi mesh may be applied to the communication between the smart engines 6130 and 6140. At least one smart engine 6130 may be connected to the communication connecting device 6100 connected to the communication network 6190 by a wired or wireless communication. In order to increase the efficiency of communication, the plurality of smart engines 6130 and 6140 may be grouped into one group and be connected to one communication connecting device 6100.

The communication connecting device 6100 may be an access point (AP) capable of performing wired or wireless communications and may relay a communication between the communication network 6190 and other devices. The communication connecting device 6100 may be connected to the communication network 6190 by at least one of the wired or wireless communication schemes. For example, the communication connecting device 6100 may be mechanically accommodated in one of the lighting apparatuses 6120 and 6150.

The communication connecting device 6100 may be connected to the mobile device 6200 through a communication protocol such as WiFi. A user of the mobile device 6200 may receive information about the ambient environment, which is collected by the plurality of smart engines 6130 and 6140, through the communication connecting device connected to the smart engine 6130 of the adjacent lighting apparatus 6120. The information about the ambient environment may include neighboring traffic information, weather information, and the like. The mobile device 6200 may be connected to the communication network 6190 through the communication base station 6180 by a wireless cellular communication scheme such as a 3G or 4G communication scheme.

The server 6160 connected to the communication network 6190 may receive information collected by the smart engines 6130 and 6140 respectively mounted on the lighting apparatuses 6120 and 6150 and may monitor the operation states of the lighting apparatuses 6120 and 6150. In order to manage the lighting apparatuses 6120 and 6150 based on the monitoring result of the operation states of the lighting apparatuses 6120 and 6150, the server 6160 may be connected to the computer 6170 that provides the management system. The computer 6170 may execute software capable of monitoring and managing the operation states of the lighting apparatuses 6120 and 6150, especially the smart engines 6130 and 6140.

Figure 39:
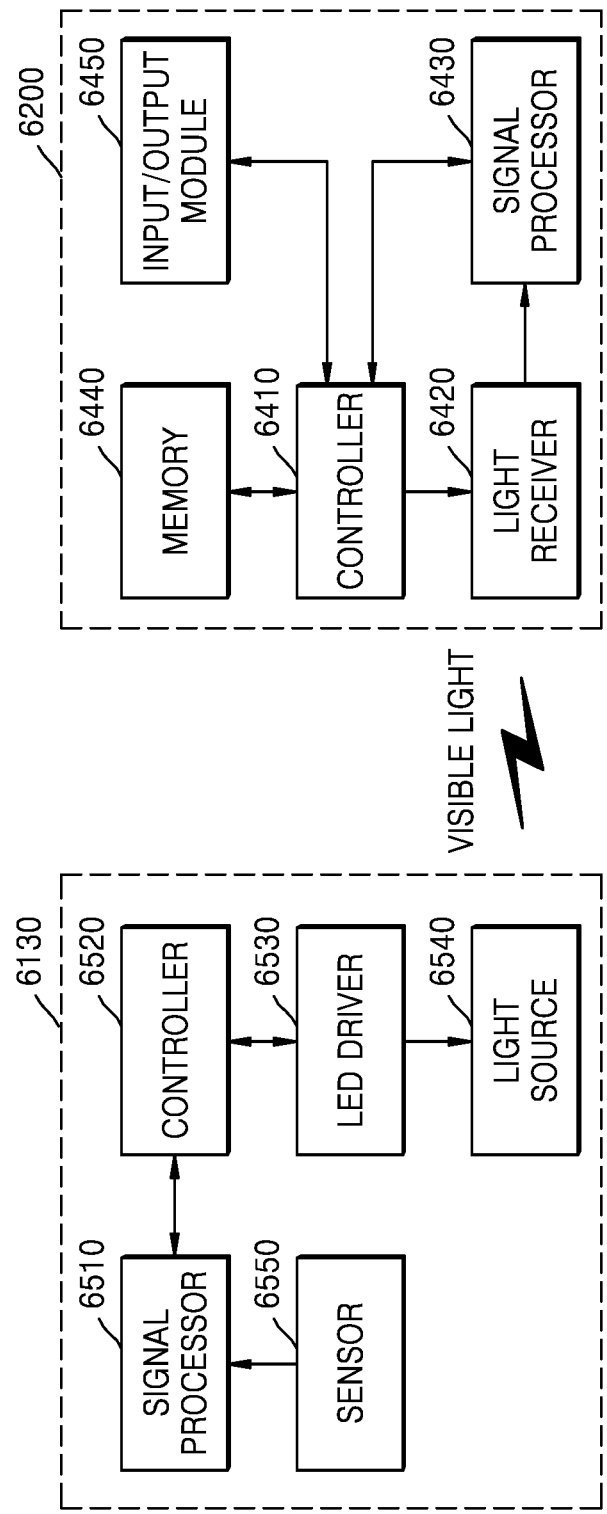
FIG. 39 is a block diagram for describing a communication operation between a smart engine of a lighting apparatus including an LED package and a mobile device, according to an exemplary embodiment.

FIG. 39 is a block diagram for describing a communication operation between a smart engine 6130 of a lighting apparatus 6120 including an LED package and a mobile device 6200, according to an exemplary embodiment.

Specifically, FIG. 39 is a block diagram for describing a communication operation between the smart engine 6130 of the lighting apparatus 6120 of FIG. 38 and the mobile device 6200 via the visible light wireless communication. Various communication schemes may be applied for transmitting information collected by the smart engine 6130 to the mobile device 6200 of the user.

Through the communication connecting device (6100 of FIG. 38) connected to the smart engine 6130, the information collected by the smart engine 6130 may be transmitted to the mobile device 6200 via the communication connecting device 6100, or the smart engine 6130 and the mobile device 6200 may be directly connected to each other. The smart engine 6130 and the mobile device 6200 may directly communicate with each other through various types of communication schemes, such as, for example, visible light wireless communication (LiFi).

The smart engine 6130 may include a signal processor 6510, a controller 6520, an LED driver 6530, a light source 6540, and a sensor 6550. The mobile device 6200, which is connected to the smart engine 6130 through the visible light wireless communication, may include a controller 6410, a light receiver 6420, a signal processor 6430, a memory 6440, and an input/output module 6450.

The visible light wireless communication (LiFi) technology is a wireless communication technology that wirelessly transmits information by using light of a visible light wavelength that a human may recognize with his or her eyes. The visible light wireless communication technology differs from the existing wired optical communication technology and infrared wireless communication in that light of the visible light wavelength, that is, a specific frequency of visible light from the LED device package, is used, and differs from the wired optical communication technology in that a communication environment is a wireless environment. Contrary to the RF wireless communication technology, the visible light wireless communication technology may freely be used without regulation or permission in terms of frequency use. In addition, the visible light wireless communication technology has excellent physical security and is different from other communication technologies in that the visible light wireless communication technology enables a user to confirm a communication link with his or her eyes. Furthermore, the visible light wireless communication technology is a convergence technology that is capable of simultaneously obtaining the unique purpose of the light source and the communication function.

The signal processor 6510 of the smart engine 6130 may process data to be transmitted and received through the visible light wireless communication. For example the signal processor 6510 may process information collected by the sensor 6550 into data and transmit the data to the controller 6520. The controller 6520 may control the operations of the signal processor 6510 and the LED driver 6530. In particular, the controller 6520 may control the operation of the LED driver 6530 based on the data transmitted by the signal processor 6510. The LED driver 6530 may transmit the data to the mobile device 6200 by turning on the light source 6540 according to a control signal transmitted by the controller 6520.

The mobile device 6200 may include the light receiver 6420 configured to recognize visible light including data, as well as the controller 6410, the memory 6440 configured to store data, the input/output module 6450 including a display, a touch screen, and an audio output unit, and the signal processor 6430. The light receiver 6420 may detect visible light and convert the detected visible light into an electrical signal. The signal processor 6430 may decode data included in the electrical signal. The controller 6410 may store the decoded data output from the signal processor 6430 in the memory 6440, or may output the decoded data through the input/output module 6450 so as to allow the user to recognize the decoded data.

Figure 40:
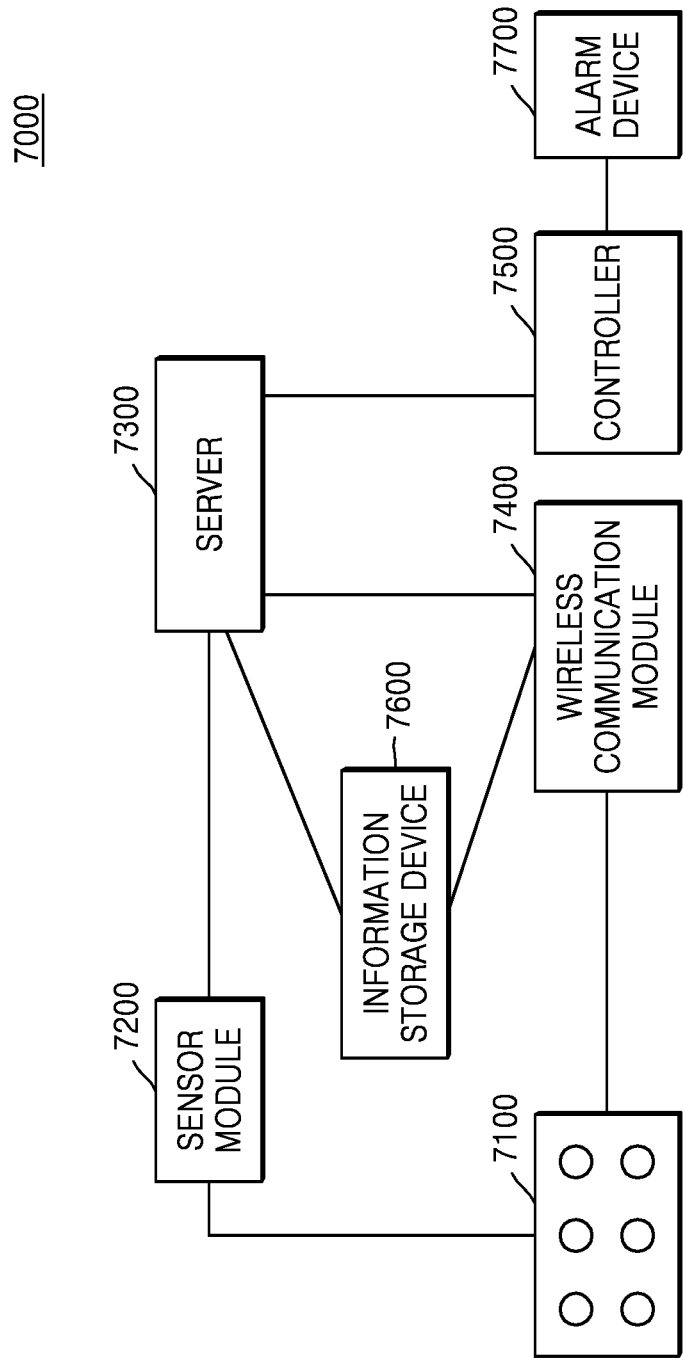
FIG. 40 is a block diagram of a smart lighting system including an LED package, according to an exemplary embodiment.

FIG. 40 is a block diagram of a smart lighting system 7000 including an LED package, according to an exemplary embodiment.

Referring to FIG. 40, the smart lighting system 7000 may include an illumination module 7100, a sensor module 7200, a server 7300, a wireless communication module 7400, a controller 7500, and an information storage device 7600. The illumination module 7100 may include one or more lighting apparatuses installed in a building and is not limited to any particular type of lighting apparatus. Examples of the lighting apparatus may include basic illuminating devices for a living room, a room, a balcony, a bathroom, stairs, and a front door, a mood illumination, a stand illumination, and a decorative illumination. The lighting apparatus may be at least one of the above-described LED packages 100 to 600 according to exemplary embodiments.

The sensor module 7200 may detect illumination states related to the turn-on/off of each lighting apparatus and the intensity of the illumination, output a signal corresponding to the detected illumination state, and transmit the signal to the server 7300. The sensor module 7200 may be provided in the building where the lighting apparatus is installed. One or more sensors module 7200 may be at a position where the illumination states of all the lighting apparatuses controlled by the smart lighting system 7000 are detectable, or may be provided at each of the lighting apparatuses.

The information about the illumination state may be transmitted to the server 7300 in real time, or may be transmitted with a time difference based on a predetermined time unit such as minutes or hours. The server 7300 may be installed inside and/or outside the building. The server 7300 may receive a signal from the sensor module 7200, collect information about the illumination state, such as the turn-on/off of the lighting apparatus within the building, group the collected information, define an illumination pattern based on the grouped information, and provide information about the defined illumination pattern to the wireless communication module 7400. In addition, the server 7300 may serve as a medium that transmits a command received from the wireless communication module 7400 to the controller 7500.

Specifically, the server 7300 may receive the information about the illumination state of the building, which is detected and transmitted by the sensor module 7200, and collect and analyze the information about the illumination state. For example, the server 7300 may divide the collected information into various groups by period, such as time, day, day of week, weekdays and weekends, a preset specified day, a week, and a month. Then, the server 7300 may program a "defined illumination pattern" defined as an illumination pattern of an average day, week, weekday, weekend, and month based on the grouped information. The "defined illumination pattern" may be periodically provided to the wireless communication module 7400, or may be received from the server 7300 in response to a request for providing information when the user requests the information about the illumination pattern.

In addition, apart from the defining of the illumination pattern from the information about the illumination state received from the sensor module 7200, the server 7300 may provide the wireless communication module 7400 with a "normal illumination pattern" programmed in advance which achieves a normal illumination state at home. As in the case of the "defined illumination pattern", the "normal illumination pattern" may be periodically provided from the server 7300, or may be provided when there is a request from a user. Only one server 7300 is illustrated in FIG. 40, but two or more servers may be provided when necessary or desired. Optionally, the "normal illumination pattern" and/or the "defined illumination pattern" may be stored in the information storage device 7600. The information storage device 7600 may be a so-called cloud that is accessible via a network.

The wireless communication module 7400 may select one of the plurality of illumination patterns received from the server 7300 and/or the information storage device 7600 and transmit a command signal for executing or stopping an "automatic illumination mode" to the server 7300. The wireless communication module 7400 may be applied to various portable wireless communication devices such as smartphones, tablet PCs, PDAs, notebook computers, or netbook computers, which may be carried by the user of the smart lighting system.

Specifically, the wireless communication module 7400 may receive various defined illumination patterns from the server 7300 and/or the information storage device 7600, select patterns from the received illumination patterns, and transmit a command signal to the server 7300 so as to execute the "automatic illumination mode" to operate the illumination module 7100 in the selected illumination pattern. The command signal may be transmitted at a set execution time. Alternatively, after the command signal is transmitted without defining a stop time, the execution of the "automatic illumination mode" may be stopped by transmitting a stop signal when necessary.

In addition, the wireless communication module 7400 may further have a function of allowing the user to partially modify the illumination pattern received from the server 7300 and/or the information storage device 7600 or manipulate a new illumination pattern when necessary or desired. The modified or newly manipulated "user setting illumination pattern" may be stored in the wireless communication module 7400, may be automatically transmitted to the server 7300 and/or the information storage device 7600, or may be transmitted when necessary or desired (e.g., according to a user request). In addition, the wireless communication module 7400 may automatically receive the "defined illumination pattern" and the "normal illumination pattern" from the server 7300 and/or the information storage device 7600, or may receive the "defined illumination pattern" and the "normal illumination pattern" by transmitting a provision request signal to the server 7300.

The wireless communication module 7400 may exchange a command or information signal with the server 7300 and/or the information storage device 7600, and the server 7300 may serve as a medium between the wireless communication module 7400, the sensor module 7200, and the controller 7500. In this manner, the smart lighting system may be operated.

The connection between the wireless communication module 7400 and the server 7300 may be performed using an application program of the smartphone. That is, the user may instruct the server 7300 to execute the "automatic illumination mode" through an application program downloaded in the smartphone, or may provide information about the user setting illumination pattern" manipulated or modified by the user.

The information may be automatically provided to the server 7300 and/or the information storage device 7600 by the storing of the "user setting illumination pattern", or may be provided by performing a transmission operation. This feature may be set as a default of the application program, or may be selected by the user according to an option.

The controller 7500 may receive the command signal of executing or stopping the "automatic illumination mode" from the server 7300, and control one or more lighting apparatuses by executing the received command signal in the illumination module 7100. That is, the controller 7500 may control the turn-on/off or the like of the lighting apparatuses included in the illumination module 7100 according to the command signal from the server 7300.

In addition, the smart lighting system 7000 may further include an alarm device 7700 in the building. The alarm device 7700 may output an alarm according to various criteria, e.g., when the alarm device 7700 detects that there is an intruder in the building.

Specifically, in a case where the "automatic illumination mode" is executed in the building in the absence of the user, when there occurs an intrusion in the building and there occurs an abnormal situation deviating from the set illumination pattern, the sensor module 7200 may detect the abnormal situation and transmit an alarm signal to the server 7300. The server 7300 may notify the wireless communication module 7400 of the abnormal situation and operate the alarm device 7700 in the building by transmitting a signal to the controller 7500.

In addition, when the alarm signal is transmitted to the server 7300, the server 7300 may directly notify a security company of an emergency situation via the wireless communication module 7400 or a TCP/IP network.

While the exemplary embodiments have been particularly shown and described with reference to certain exemplary embodiments thereof, it will be understood that various changes in form and details may be made therein without departing from the spirit and scope of the following claims.

What is claimed is:

1. A light-emitting diode (LED) package comprising:
    a light-emitting structure comprising a first conductive-type semiconductor layer, an active layer provided on the first conductive-type semiconductor layer, and a second conductive-type semiconductor layer provided on the active layer;
    an isolating insulation layer provided on two side portions of the light-emitting structure and an upper portion of the light-emitting structure, the upper portion connecting the two side portions;
    a first connection electrode portion electrically connected to the first conductive-type semiconductor layer;
    a second connection electrode portion electrically connected to the second conductive-type semiconductor layer;
    a first electrode pad electrically connected to the first connection electrode portion;
    a second electrode pad electrically connected to the second connection electrode portion;
    a first molding resin layer provided between the first electrode pad and the second electrode pad;
    a first pillar electrode electrically connected to the first electrode pad;
    a second pillar electrode electrically connected to the second electrode pad; and
    a second molding resin layer provided on the first molding resin layer, the first electrode pad, and the second electrode pad, and between the first pillar electrode and the second pillar electrode.

2. The LED package of claim 1, wherein the first molding resin layer comprises a material layer which has a reflectivity that is higher than a reflectivity of the second molding resin layer, and the second molding resin layer comprises a material layer which has a reliability that is higher than a reliability of the first molding resin layer.

3. The LED package of claim 1, wherein the first molding resin layer is an encapsulation layer sealing a gap between the first electrode pad and the second electrode pad.

4. The LED package of claim 3, further comprising a first reflective layer provided on the first molding resin layer.

5. The LED package of claim 4, further comprising a second reflective layer provided between the first molding resin layer and the second molding resin layer.

6. The LED package of claim 1, wherein the first molding resin layer contacts a surface and a side wall of the first electrode pad, a surface and a sidewall of the second electrode pad, a side wall of the first pillar electrode, and a sidewall of the second pillar electrode, and the second molding resin layer contacts the first molding resin layer.

7. The LED package of claim 1, wherein the second molding resin layer is an encapsulation layer sealing a gap between the first pillar electrode and the second pillar electrode.

8. The LED package of claim 1, wherein the light-emitting structure is a mesa-type light-emitting structure, the isolating insulation layer insulates the mesa-type light-emitting structure, the first connection electrode portion comprises a pole electrode layer penetrating the isolating insulation layer, and the light-emitting structure further comprises a first contact layer provided on the first conductive-type semiconductor layer under the pole electrode layer.

9. The LED package of claim 1, wherein the light-emitting structure is a mesa-type light-emitting structure, the isolating insulation layer insulates the mesa-type light-emitting structure, the second connection electrode portion comprises a plate electrode layer, and the plate electrode layer is provided in the isolating insulation layer, and the light-emitting structure further comprises a second contact layer provided on the second conductive-type semiconductor layer under the plate electrode layer.

10. The LED package of claim 1, wherein the first electrode pad and the second electrode pad are provided on the isolating insulation layer on the upper portion and the two side portions of the light-emitting structure.

11. A light-emitting diode (LED) package comprising:
a first pad area comprising:
a first portion of a light-emitting structure comprising a first conductive-type semiconductor layer, an active layer, and a second conductive-type semiconductor layer, and
a first electrode pad electrically connected to the first conductive-type semiconductor layer;
a second pad area comprising:
a second portion of the light-emitting structure, and
a second electrode pad electrically connected to the second conductive-type semiconductor layer;
a pad isolating area which comprises a first molding resin layer and electrically isolates the first pad area and the second pad area from each other;
a first pillar electrode provided on the first electrode pad in the first pad area and a second pillar electrode provided on the second electrode pad in the second pad area; and
a second molding resin layer provided between the first pillar electrode in the first pad area and the second pillar electrode in the second pad area, and on the pad isolating area,
wherein the first molding resin layer has a reflectivity that is higher than a reflectivity of the second molding resin layer.

12. The LED package of claim 11, wherein the second molding resin layer comprises a material layer which has a reliability that is higher than a reliability of the first molding resin layer.

13. The LED package of claim 11, further comprising a first reflective layer provided on the first molding resin layer in the pad isolating area.

14. The LED package of claim 11, wherein the first molding resin layer contacts a surface of the first electrode pad, a surface of the second electrode pad, a side wall of the first pillar electrode, and a side wall of the second pillar electrode, and the second molding resin layer contacts the first molding resin layer in the pad isolating area.

15. The LED package of claim 11, further comprising a second reflective layer provided between the first molding resin layer and the second molding resin layer in the first pad area, the second pad area, and the pad isolating area.

16. An illumination apparatus comprising:
a first electrode pad;
a first electrode provided on the first electrode pad;
a second electrode pad;
a second electrode provided on the second pad;
a first molding resin layer provided between the first electrode pad and the second electrode pad;
a second molding resin layer provided between the first electrode and the second electrode; and
a reflective layer provided between the first molding resin layer and the second molding resin layer,
wherein the first molding resin layer has a reflectivity that is higher than a reflectivity of the second molding resin layer.

17. The illumination apparatus of claim 16, wherein the reflective layer comprises a distributed Bragg reflector.

18. The illumination apparatus of claim 16, wherein the first molding resin layer comprises a portion having a concave shape and the second molding resin layer is provided inside of the concave shape.

19. The LED package of claim 16, wherein:
the second molding resin layer comprises a material layer which has a reliability that is higher than a reliability of the first molding resin layer, and
the reliability of the second molding resin layer comprises reliability in terms of at least one of wetting, tolerance, or strength.

* * * * *